(12) United States Patent
Xie et al.

(10) Patent No.: US 11,201,152 B2
(45) Date of Patent: Dec. 14, 2021

(54) METHOD, APPARATUS, AND SYSTEM FOR FIN-OVER-NANOSHEET COMPLEMENTARY FIELD-EFFECT-TRANSISTOR

(71) Applicant: GLOBALFOUNDRIES INC., Grand Cayman (KY)

(72) Inventors: Ruilong Xie, Niskayuna, NY (US); Steven Soss, Cornwall, NY (US); Steven Bentley, Menands, NY (US); Daniel Chanemougame, Niskayuna, NY (US); Julien Frougier, Albany, NY (US); Bipul Paul, Mechanicville, NY (US); Lars Liebmann, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 122 days.

(21) Appl. No.: 15/958,426

(22) Filed: Apr. 20, 2018

(65) Prior Publication Data
US 2019/0326286 A1  Oct. 24, 2019

(51) Int. Cl.
| H01L 29/76 | (2006.01) |
|---|---|
| H01L 29/94 | (2006.01) |
| H01L 31/062 | (2012.01) |
| H01L 31/113 | (2006.01) |
| H01L 31/119 | (2006.01) |

(Continued)

(52) U.S. Cl.
CPC .... *H01L 27/0924* (2013.01); *H01L 21/02532* (2013.01); *H01L 21/823814* (2013.01); *H01L 21/823821* (2013.01); *H01L 21/823828* (2013.01); *H01L 21/823864* (2013.01); *H01L 27/0922* (2013.01); *H01L 29/0649* (2013.01); *H01L 29/0665* (2013.01); *H01L 29/0847* (2013.01); *H01L 29/42392* (2013.01); *H01L 29/66545* (2013.01); *H01L 21/0262* (2013.01); *H01L 21/02181* (2013.01);

(Continued)

(58) Field of Classification Search
CPC ....... H01L 21/02532; H01L 21/823814; H01L 21/823821; H01L 21/823828; H01L 21/823864; H01L 29/0649; H01L 29/0665; H01L 29/0847; H01L 29/42392; H01L 29/66545; H01L 27/0922; H01L 21/8228; H01L 21/8238; H01L 27/0826; H01L 27/092
USPC ......................................................... 257/369
See application file for complete search history.

(56) References Cited

U.S. PATENT DOCUMENTS

| 7,393,732 B2 * | 7/2008 | Rim ...................... H01L 21/84 257/E21.561 |
|---|---|---|
| 8,232,598 B2 * | 7/2012 | Yamazaki ........... H01L 27/0688 257/351 |

(Continued)

*Primary Examiner* — Kimberly N Rizkallah
*Assistant Examiner* — Dilinh P Nguyen
(74) *Attorney, Agent, or Firm* — Williams Morgan, P.C.

(57) ABSTRACT

A semiconductor device at least one first transistor of a first type disposed above a substrate and comprising a channel wider in one cross-section than tall, wherein the first type is a PFET transistor or an NFET transistor; and at least one second transistor of a second type disposed above the at least one first transistor and comprising a channel taller in the one cross-section than wide, wherein the second type is a PFET transistor or an NFET transistor, and the second type is different from the first type. Methods and systems for forming the semiconductor structure.

5 Claims, 24 Drawing Sheets

(51) Int. Cl.
*H01L 27/092* (2006.01)
*H01L 29/06* (2006.01)
*H01L 21/8238* (2006.01)
*H01L 21/02* (2006.01)
*H01L 29/66* (2006.01)
*H01L 29/423* (2006.01)
*H01L 29/08* (2006.01)
H01L 21/3065 (2006.01)
H01L 21/306 (2006.01)
H01L 29/51 (2006.01)

(52) U.S. Cl.
CPC .... *H01L 21/3065* (2013.01); *H01L 21/30625* (2013.01); *H01L 29/517* (2013.01)

(56) References Cited

U.S. PATENT DOCUMENTS

| | | | |
|---|---|---|---|
| 9,741,814 B2* | 8/2017 | Matsumoto | H01L 29/4966 |
| 10,043,900 B1* | 8/2018 | Bi | H01L 29/7827 |
| 2015/0325575 A1* | 11/2015 | Park | H01L 29/0653 |
| | | | 257/401 |

* cited by examiner

METHOD, APPARATUS, AND SYSTEM FOR FIN-OVER-NANOSHEET COMPLEMENTARY FIELD-EFFECT-TRANSISTOR

BACKGROUND OF THE INVENTION

Field of the Invention

Generally, the present disclosure relates to the manufacture of semiconductor devices, and, more specifically, to various methods, structures, and systems for preparing semiconductor devices containing fin-over-nanosheet complementary field-effect-transistor devices.

Description of the Related Art

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using semiconductor-manufacturing tools, such as exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one conductive region on the semiconductor wafer to another. In this manner, integrated circuit chips may be fabricated.

Fin field-effect transistors (FinFET) devices have been developed to replace conventional planar bulk MOSFETs in advanced CMOS technology by improving electrostatic control of the channel. Extending the concept of the finFET to further improve electrostatics involves developing structures Efforts to increase transistor density have led to consideration of a complementary FET (CFET) device. In a CFET device, various FET devices are stacked together. One such CFET device architecture is a nanowire/nanowire structure, in which multiple nanowire structures are stacked above each other, such as a PFET nanowire over an NFET nanowire or vice versa. However, nanowire/nanowire CFET device architectures tend to have undesirably low effective channel width (Weff) values.

A second CFET device architecture is a fin/fin structure, in which multiple fins are stacked above each other, such as a PFET fin over an NFET fin or vice versa. However, fin/fin CFET device architectures tend to fail due to mechanical instability arising from the fin/fin stack being too high to be stable. For example, a typical fin stack containing silicon channels with silicon-germanium spacers and a hard mask cap that is about 10-12 nm wide is unstable at heights of about 190 nm above the substrate.

A third CFET device architecture is a nanosheet/nanosheet structure, in which multiple nanosheets are stacked above each other, such as a PFET nanosheet over an NFET nanosheet or vice versa. However, nanosheet/nanosheet device architectures tend to suffer defects when forming the work function metals (WFMs) of the two nanosheets. For example, in a PFET nanosheet over NFET nanosheet structure, WFM formation involves depositing the lower, NFET WFM around all nanosheets, both NFET and PFET; masking the NFET WFM on the NFET nanosheet(s) with an organic polymerization layer (OPL); removing the NFET WFM from the PFET nanosheet(s); and depositing the upper, PFET WFM around the PFET nanosheet(s). However, if the OPL cannot fill the space between the uppermost of the lower, NFET nanosheets and the lowermost of the upper, PFET nanosheets, then removing the NFET WFM from the PFET nanosheets may also damage the NFET WFM on the NFET nanosheets, such as by undercut the void in the OPL between the uppermost NFET nanosheet and the lowermost PFET nanosheet. Also, even if the OPL lacks such a void, the length of time required for an isotropic etch to remove the NFET WFM from between PFET nanosheets will tend to damage the NFET WFM around the NFET nanosheets as well.

The present disclosure may address and/or at least reduce one or more of the problems identified above.

SUMMARY OF THE EMBODIMENTS

The following presents a simplified summary of the exemplary embodiments in order to provide a basic understanding of some aspects of the disclosure. This summary is not an exhaustive overview of the embodiments. It is not intended to identify key or critical elements of the disclosure or to delineate the scope of the disclosure. Its sole purpose is to present some concepts in a simplified form as a prelude to the more detailed description that is discussed later.

Generally, the present disclosure is directed to various semiconductor devices containing at least one first transistor of a first type disposed above a substrate and containing a channel wider in one cross-section than tall, wherein the first type is a PFET transistor or an NFET transistor; and at least one second transistor of a second type disposed above the at least one first transistor and including a channel taller in the one cross-section than wide, wherein the second type is a PFET transistor or an NFET transistor, and the second type is different from the first type.

The present disclosure is also directed to various methods for forming a semiconductor device, such as a method including forming a nanosheet structure on a semiconductor substrate, wherein the nanosheet structure contains at least one first channel wider in one cross-section than tall; forming a spacer on the nanosheet structure; forming at least one fin on the spacer, wherein each fin contains a second channel taller in the one cross-section than wide; depositing a first work function metal (WFM) of a first type on a top and on at least two opposite sides of each first channel and each second channel, wherein the first type is a PFET WFM or an NFET WFM; masking the first WFM on each first channel; removing the first WFM from each second channel; and depositing a second WFM of a second type on a top and on at least two opposite sides of each second channel, wherein the second type is a PFET WFM or an NFET WFM, and the second type is different from the first type.

The present disclosure is also directed to various semiconductor device manufacturing systems configured to implement a method referred to above.

BRIEF DESCRIPTION OF THE DRAWINGS

The disclosure may be understood by reference to the following description taken in conjunction with the accompanying drawings, in which like reference numerals identify like elements, and in which.

Figure 1:
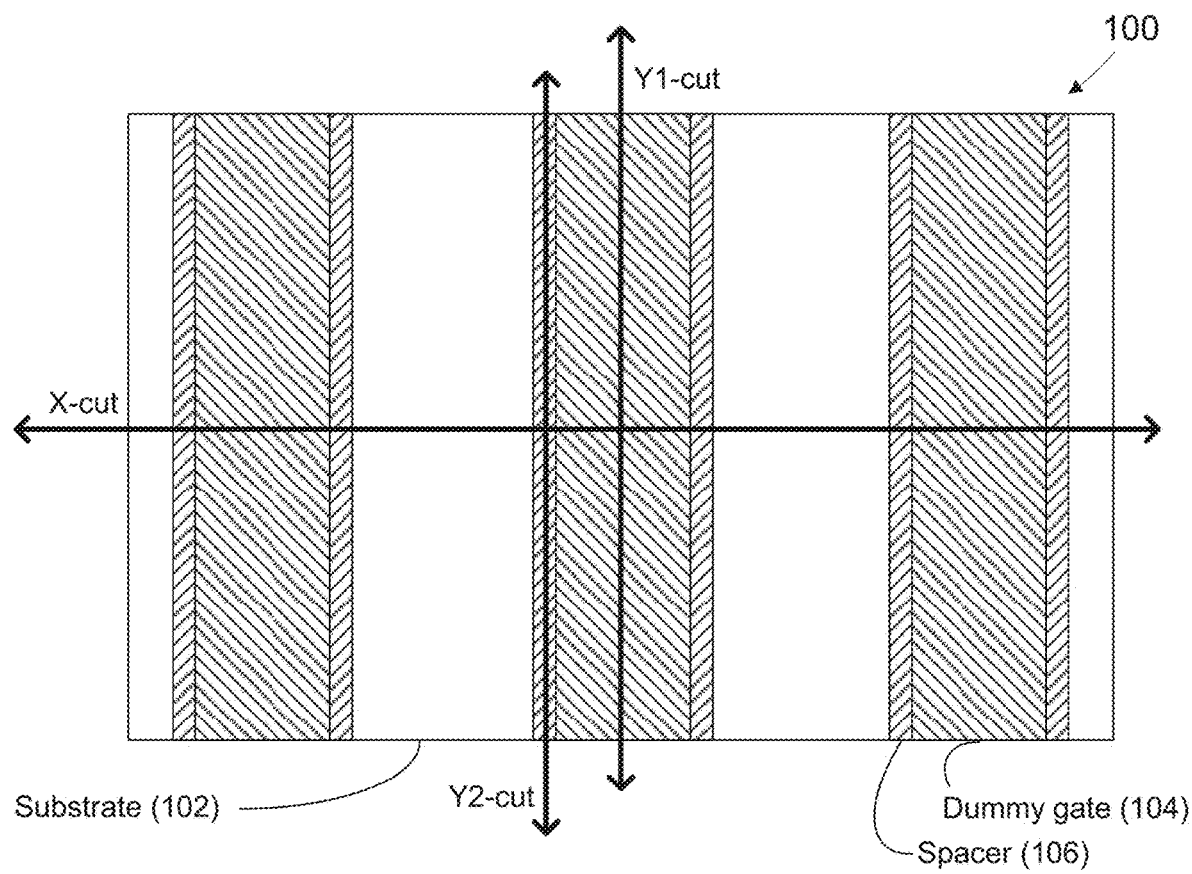
FIG. 1 illustrates a stylized top view of a semiconductor device, in which X-cut, Y1-cut, and Y2-cut cross-sections depicted in subsequent figures are indicated, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for forming semiconductor devices containing complementary FETs (CFETs). Embodiments herein provide for a method that includes forming a nanosheet structure on a semiconductor substrate, wherein the nanosheet structure includes at least one first channel wider in one cross-section than tall. The embodiments herein also provide for forming a spacer on the nanosheet structure; forming at least one fin on the spacer, wherein each fin contains a second channel taller in the one cross-section than wide; depositing a first work function metal (WFM) of a first type on a top and on at least two opposite sides of each first channel and each second channel. The first type of WFM is a PFET WFM or an NFET WFM. Embodiments herein also call for masking the first WFM on each first channel; removing the first WFM from each second channel; and depositing a second WFM of a second type on a top and on at least two opposite sides of each second channel. The second type of WFM can also be a PFET WFM or an NFET WFM, however, the second type of WFM is different from the first type of WFM.

Embodiments herein provide for manufacturing systems for forming semiconductor devices containing CFETs.

Embodiments herein provide for semiconductor devices containing CFETs. Embodiments herein provide for a semiconductor device containing at least one first transistor of a first type disposed above a substrate and containing a channel wider in one cross-section than tall. The first type of transistor is a PFET transistor or an NFET transistor. The semiconductor device also includes at least one second transistor of a second type disposed above the at least one first transistor and including a channel taller in the one cross-section than wide. The second type also can be a PFET transistor or an NFET transistor, however, the second type transistor is different from the first type of transistor.

Figure 6:
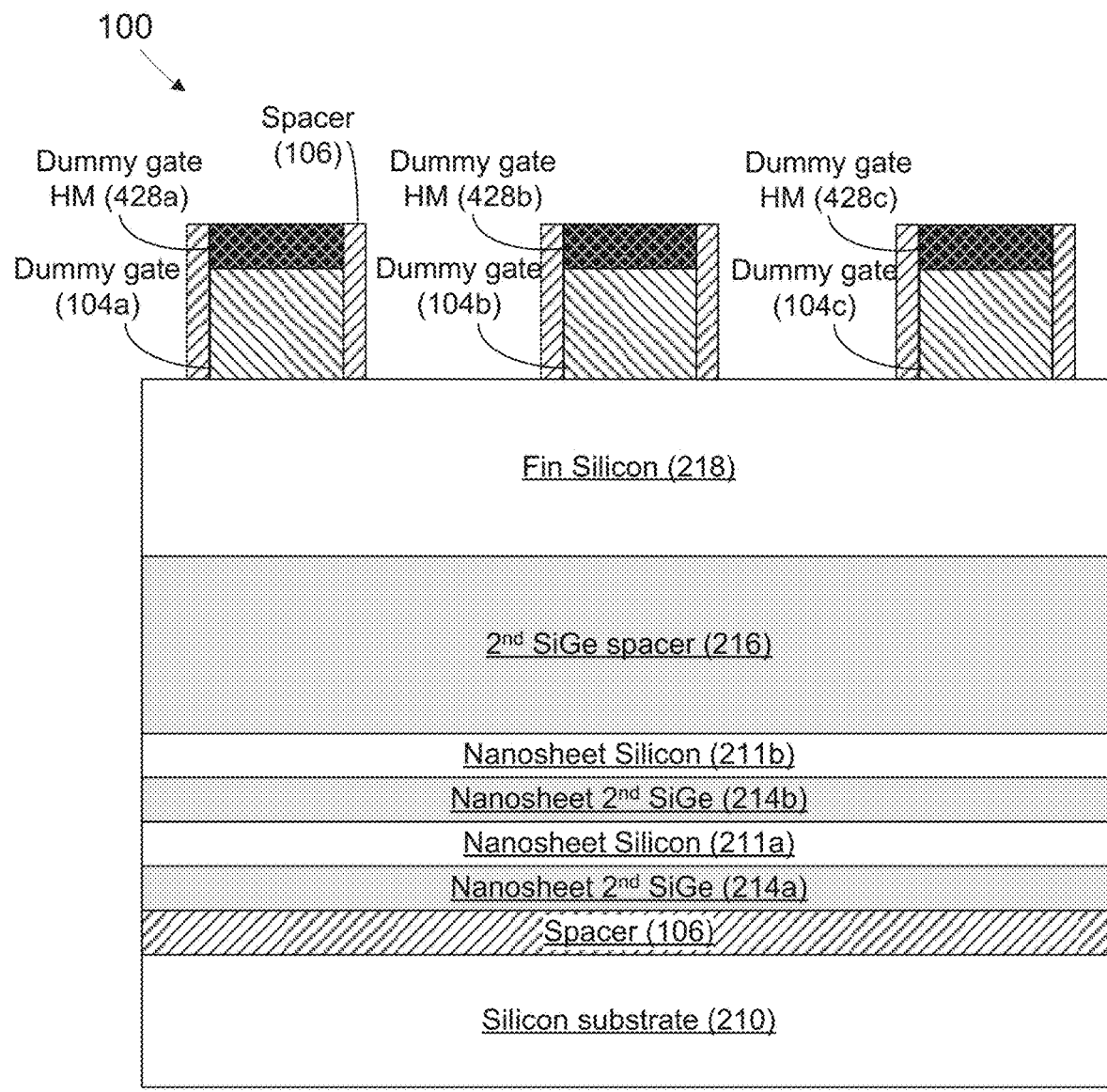
FIG. 6 illustrates a stylized X-cut cross-sectional depiction of the semiconductor device of FIGS. 4-5 after a fourth stage of processing in accordance with embodiments herein.
Figure 7:
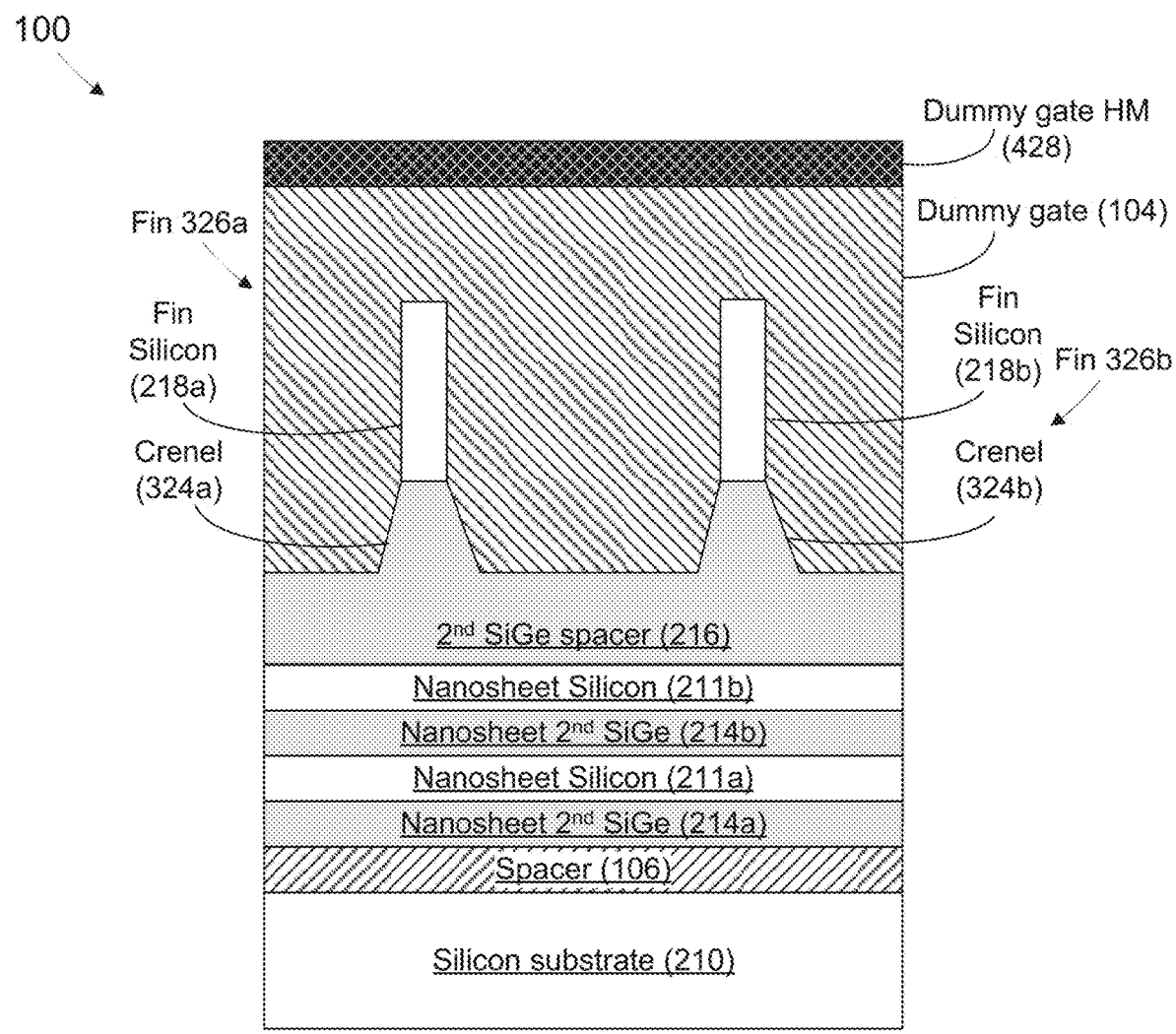
FIG. 7 illustrates a stylized Y1-cut cross-sectional depiction of the semiconductor device of FIGS. 4-5 after the fourth stage of processing in accordance with embodiments herein.

Turning to FIG. 1, a simplified top or plan view of a semiconductor structure, generally denoted by 100, obtained during an intermediate stage of semiconductor fabrication shown in FIGS. 6-7 and described in more detail below, is depicted. (For ease of illustration, the dummy gate hard mask 428 shown in FIGS. 6-7 is omitted from FIG. 1) At the stage of fabrication depicted in FIG. 1, the semiconductor structure 100 contains a semiconductor substrate layer 102. The semiconductor substrate layer 102 may contain a bulk semiconductor material, for example, bulk silicon; a silicon-on-insulator (SOI) structure; or other material known to the person of ordinary skill in the art for use a semiconductor substrate.

The semiconductor structure 100 depicted in FIG. 1 also includes at least one dummy gate 104. Although the depicted embodiment shows three dummy gates 104, the person of ordinary skill in the art having the benefit of the present disclosure will through the exercise of routine skill be able to prepare a semiconductor device 100 containing one, two, three, four, five, etc. dummy gates 104.

As shown in FIG. 1, the semiconductor device 100 also contains a spacer 106 disposed on sidewalls of the dummy gate 104. The spacer 106 may include any known spacer material. In one embodiment, the spacer 106 contains a low-k dielectric material (k value<7.0).

Subsequent stylized cross-sectional depictions of the semiconductor device 100 according to embodiments herein will be taken along one of three cuts, an X-cut (through and perpendicular to the long axis of dummy gates 104), a Y1-cut (through and along the long axis of a dummy gate 104), and a Y2-cut (through and along the long axis of the spacer 106 disposed on the sidewall of a dummy gate 104).

Figure 2:
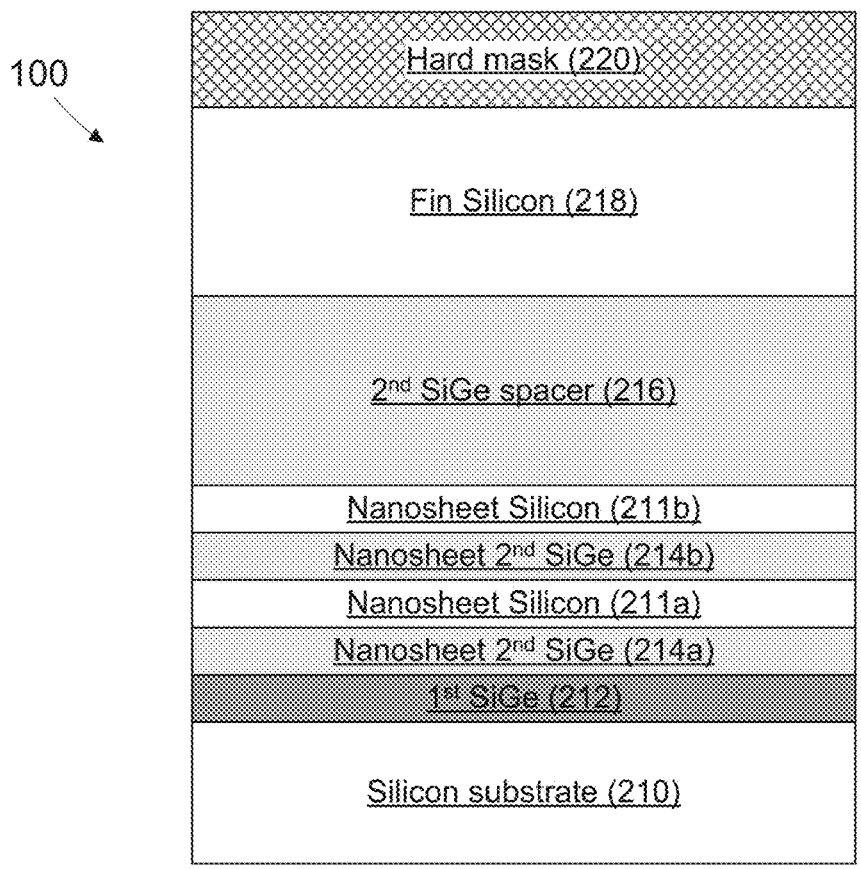
FIG. 2 illustrates a stylized Y1-cut cross-sectional depiction of a semiconductor device after a first stage of processing in accordance with embodiments herein.

FIG. 2 illustrates a stylized Y1-cut cross-sectional depiction of the semiconductor device 100 after a first stage of processing in accordance with embodiments herein. In this first stage of processing, a stack of silicon and silicon germanium layers for a nanosheet structure and a fin structure have been deposited on a silicon substrate 210. The lowermost layer deposited on the silicon substrate 210 is a first silicon germanium (SiGe) layer 212. A plurality of second SiGe layers 214a, 214b interposed with a plurality of silicon layers 211a, 211b are deposited on the first SiGe layer 212.

The first SiGe layer 212 has a germanium concentration higher than that of the second SiGe layers 214. This may permit etch selectivity, e.g., the first SiGe layer 212 may be etched by processes that do not substantially etch the second SiGe layers 214. In one embodiment, the first SiGe layer 212 has a germanium concentration of about 60 atom % germanium, and each second SiGe layer 214 has a germanium concentration of about 35 atom % germanium. The silicon layers 211a, 211b may, but need not, be identical in structure to silicon substrate 210.

The second SiGe layers 214a, 214b and silicon layers 211a, 211b will provide various layers of a nanosheet structure described in more detail below. Hence, silicon layers 211a and 211b may be referred to as "nanosheet silicon." Although two second SiGe layers 214a, 214b and two nanosheet silicon layers 211a, 211b are shown in FIG. 2 and subsequent figures, the number of second SiGe layers 214 and nanosheet silicon layers 211 may be one, two, three, four, or more. The number of second SiGe layers 214 and nanosheet silicon layers 211 may be equal or may differ by one, depending on whether the lowermost layer above the first SiGe layer 212 is a second SiGe layer 214 or a nanosheet silicon layer 211.

Above the uppermost nanosheet layer, e.g., nanosheet silicon layer 211b in FIG. 2, is formed below a second SiGe spacer 216. For convenience, the second SiGe spacer 216 may, but need not, have the same germanium concentration as the nanosheet second SiGe layers 214. The second SiGe spacer 216 has a germanium concentration less than that of the first SiGe layer 212.

Above the second SiGe spacer 216, a fin silicon layer 218 is formed. The term "fin silicon" is used because silicon layer 218 will become part of a fin 326, as will be shown below. The fin silicon layer 218 may, but need not, have the same composition and structure as nanosheet silicon layers 211. A hard mask 220 is formed on the fin silicon layer 218.

The first SiGe layer 212, the second SiGe layers 214, the second SiGe spacer 216, and the silicon layers 211 and 218 may be formed by any appropriate processes. These layers may be formed, for example, by various epitaxial growth processes such as ultra-high vacuum chemical vapor deposition (UHV-CVD), low-pressure CVD (LPCVD), reduced-pressure CVD (RPCVD), rapid thermal CVD (RTCVD), and molecular beam epitaxy (MBE). In one example, the CVD-based epitaxial growth may take place at a temperature of between about 400° C. to about 1100° C., while molecular beam epitaxy may use a lower temperature. In a specific example, the first SiGe layer 212, the second SiGe layers 214, and/or the second SiGe spacer 216 may be selectively epitaxially grown using halogermanes and silanes as the source gases at temperatures around 600° C.

The first SiGe layer 212, the second SiGe layers 214, the second SiGe spacer 216, and the silicon layers 211 and 218 may have any appropriate thickness in view of considerations set forth below. Desirably, the second SiGe spacer 216 has a height at least about three times the height of each nanosheet silicon layer 211a or 211b. For example, in an X-cut, Y1-cut, or Y2-cut view, the nanosheet silicon layers 211a and 211b may each have a height of about 5 nm, and the second SiGe spacer 216 may have a height of about 20 nm. Exemplary advantages arising from the height of the second SiGe spacer 216 will be discussed below.

FIGS. 3A-3E illustrate a stylized Y1-cut cross-sectional depiction of the semiconductor device of FIG. 2 during (FIGS. 3A-3D) and after (FIG. 3E) a second stage of processing in accordance with embodiments herein. In this second stage of processing, an etch process has been performed under conditions which pattern the hard mask 220 and the fin silicon 218 and partially etch the second SiGe spacer 216. The etch yields fins 326a and 326b (collectively "326"), containing a fin silicon 218a or 218b, respectively, and a hard mask 220a or 220b, respectively.

The partial etch of the second SiGe spacer 216 yields crenels 324a, 324b resembling crenels on the walls of a castle. The crenels 324 may also be considered "teeth" as on a comb or a lower jaw, or "candles" as on a layered "birthday cake" containing the lower, un-etched portion of the second SiGe spacer 216 and the nanosheet layers 211 and 214. Each fin 326 is disposed on one crenel 324.

Although FIGS. 3A-3E shows two fins 326a, 326b are formed on one nanosheet structure (the combination of layers 214 and 211), any number of fins 326 may be formed on one nanosheet structure, such as one fin, two fins, three fins, four fins, etc.

The partial etch of the second SiGe spacer 216 protects nanosheet layers, such as nanosheet silicon 211b, from the etching. The partial etch also allows more thorough deposition of other spacer materials between nanosheet silicon 211b and fin silicon 218a or 218b in subsequent processes described in more detail later.

Figure 3A:
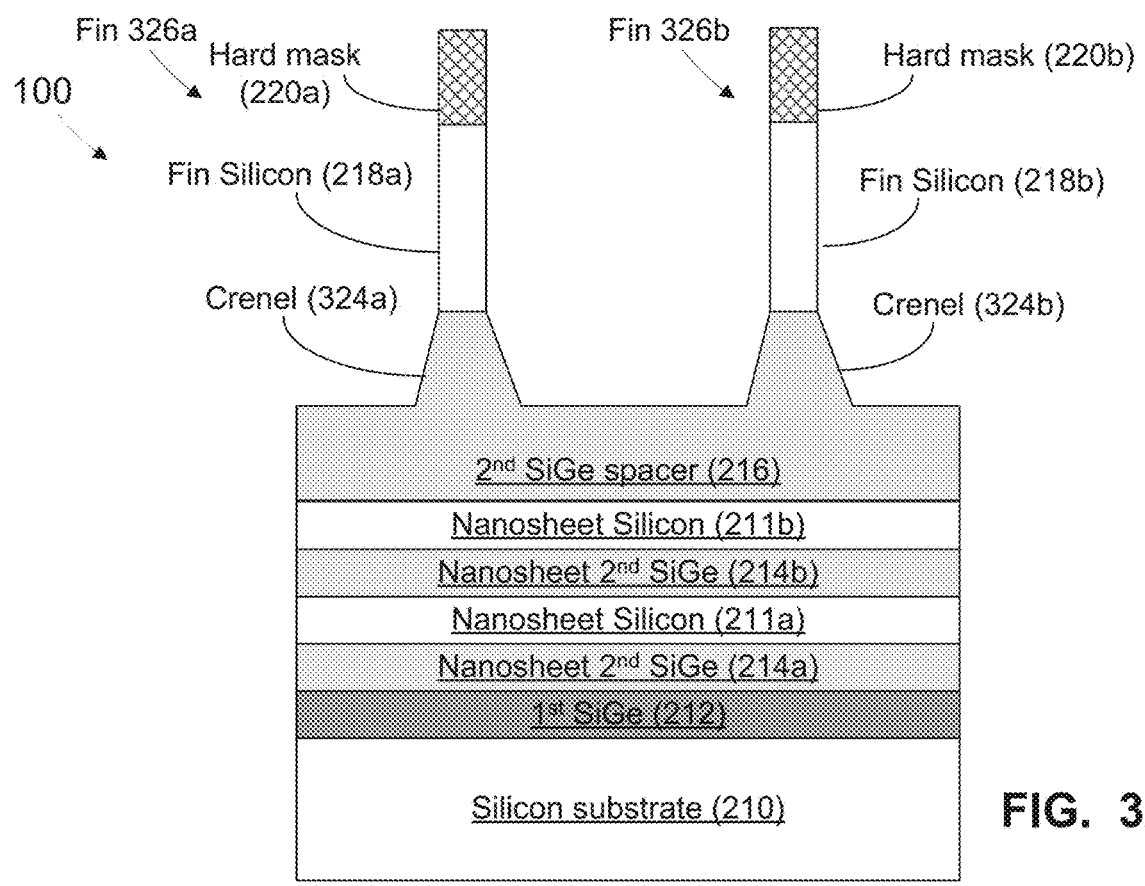
FIG. 3A illustrates a stylized Y1-cut cross-sectional depiction of the semiconductor device of FIG. 2 during a second stage of processing in accordance with embodiments herein.
Figure 3B:
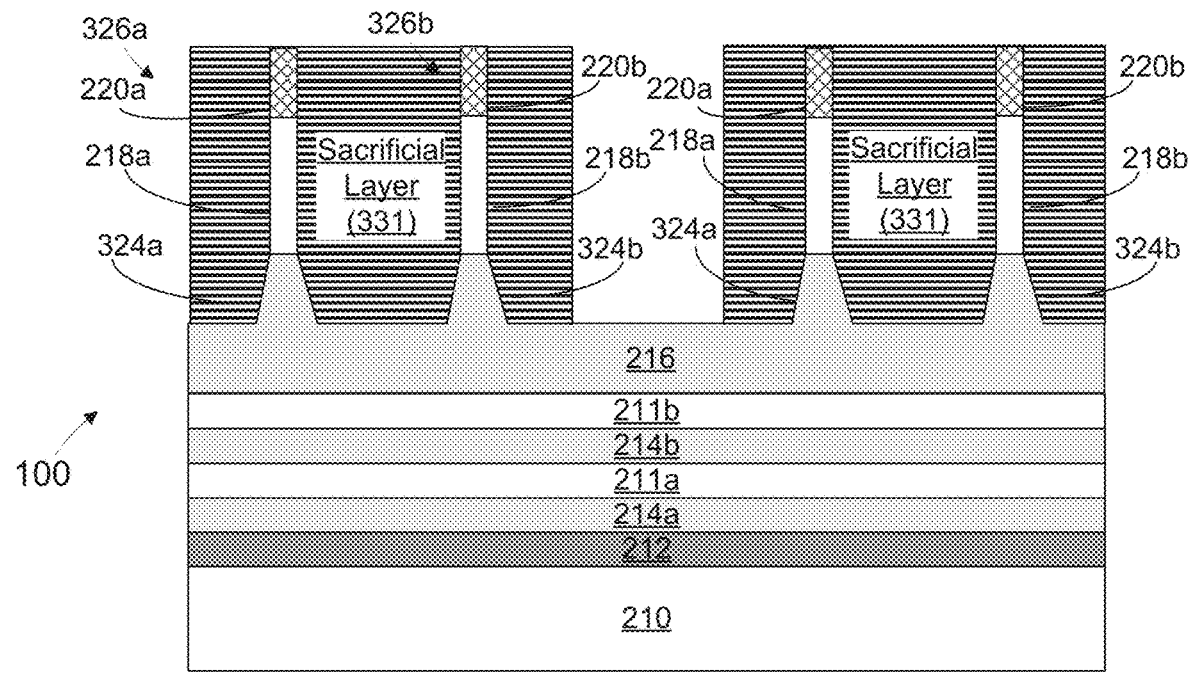
FIG. 3B illustrates a stylized Y1-cut cross-sectional depiction of the semiconductor device of FIG. 2 during the second stage of processing in accordance with embodiments herein.
Figure 3C:
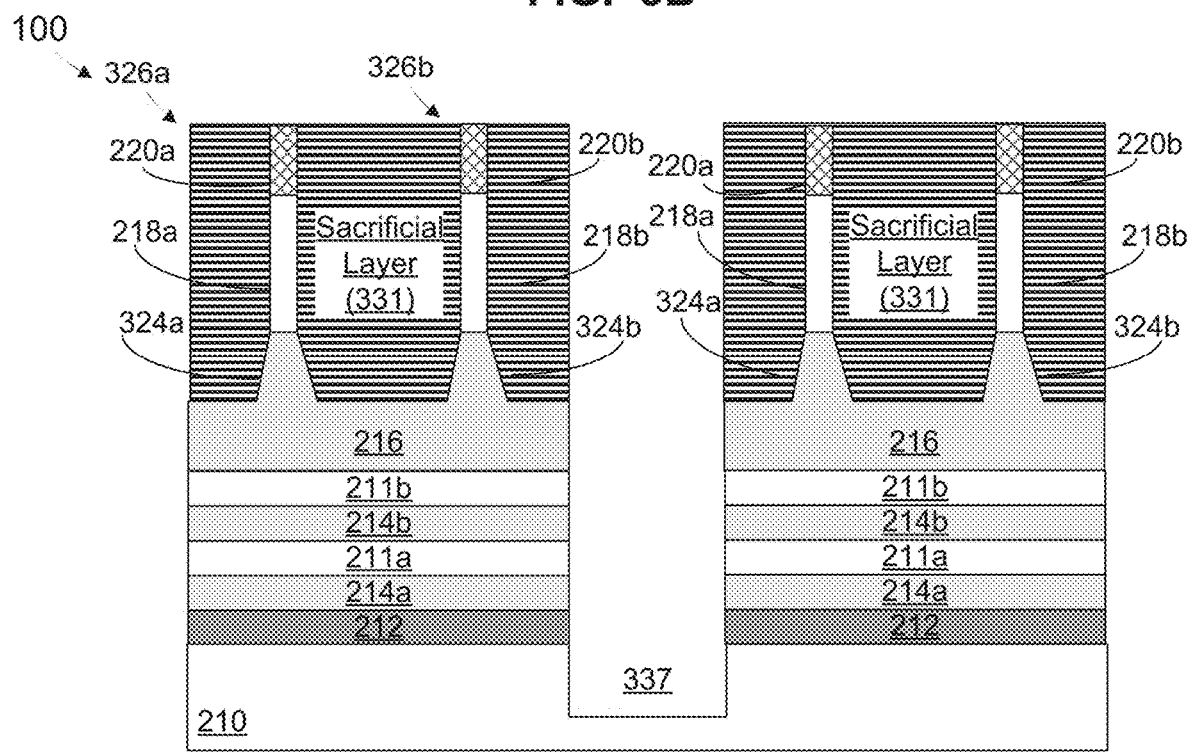
FIG. 3C illustrates a stylized Y1-cut cross-sectional depiction of the semiconductor device of FIG. 2 during the second stage of processing in accordance with embodiments herein.
Figure 3D:
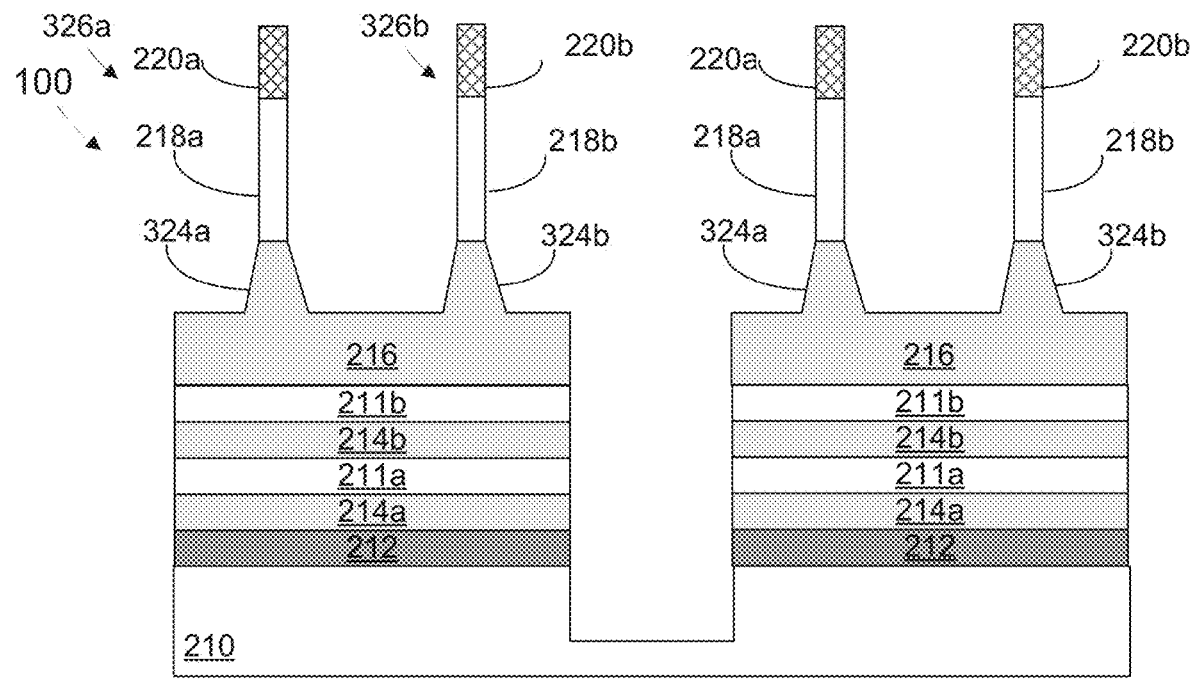
FIG. 3D illustrates a stylized Y1-cut cross-sectional depiction of the semiconductor device of FIG. 2 during the second stage of processing in accordance with embodiments herein.
Figure 3E:
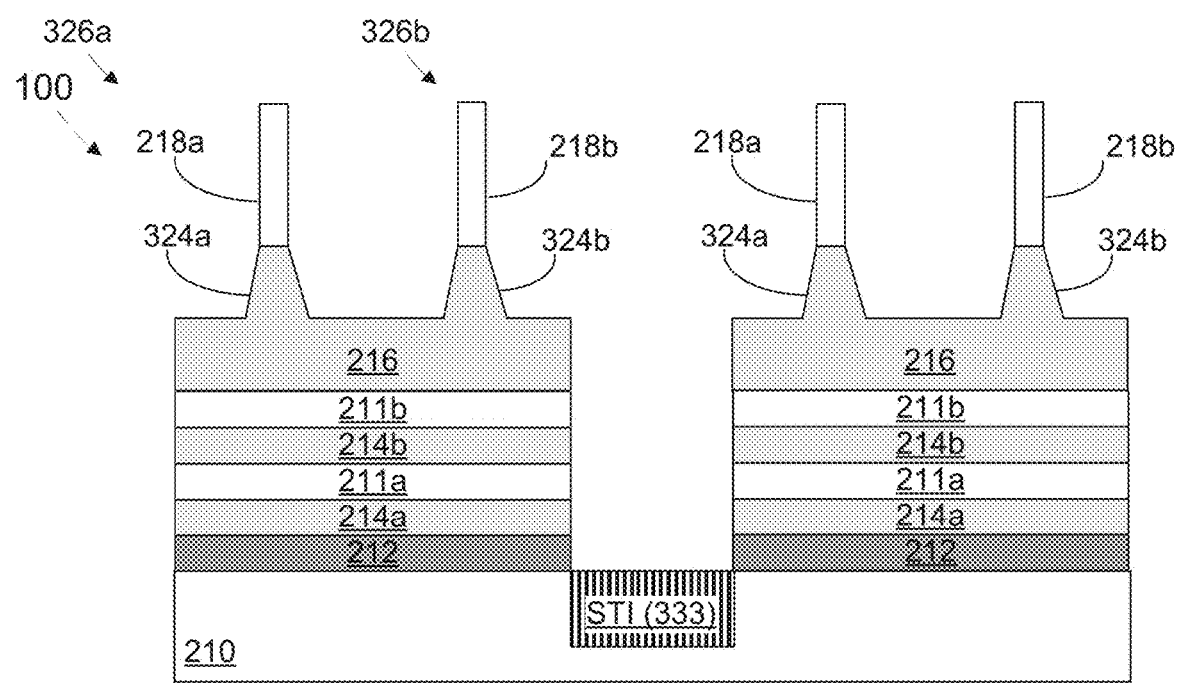
FIG. 3E illustrates a stylized Y1-cut cross-sectional depiction of the semiconductor device of FIG. 2 after the second stage of processing in accordance with embodiments herein.

After fins 326 are formed over a nanosheet structure, portions of the nanosheet structure lacking overlying fins (not shown in FIGS. 3A-3E; such portions would extend the silicon 210, first SiGe layer 212, second SiGe layers 214a, 214b, nanosheet silicon layers 211a, 211b, and lower un-etched portion of the second SiGe spacer 216 to the left and right of the view in FIGS. 3A-3E) may be removed. A sacrificial layer is deposited over the fins 326, such as by atomic layer deposition (ALD) (not shown). This process may be followed by a non-selective reactive ion etch (ME) down through the lower un-etched portion of the second SiGe spacer 216, nanosheet silicon layers 211, second SiGe layers 214, and first SiGe layer 212, and partially into silicon substrate 210. The non-selective RIE forms recesses 337 in the silicon substrate 210 (not shown in FIG. 3C, disposed to the left and right of silicon substrate 210 in the view of FIGS. 3C-3E). The sacrificial layer over the fins 326 is then removed and a shallow trench isolation (STI) material is disposed in the recesses in the silicon substrate 210 (FIG. 3E). The removal of the sacrificial layer and the formation of the STI may be formed in either order.

Figure 4:
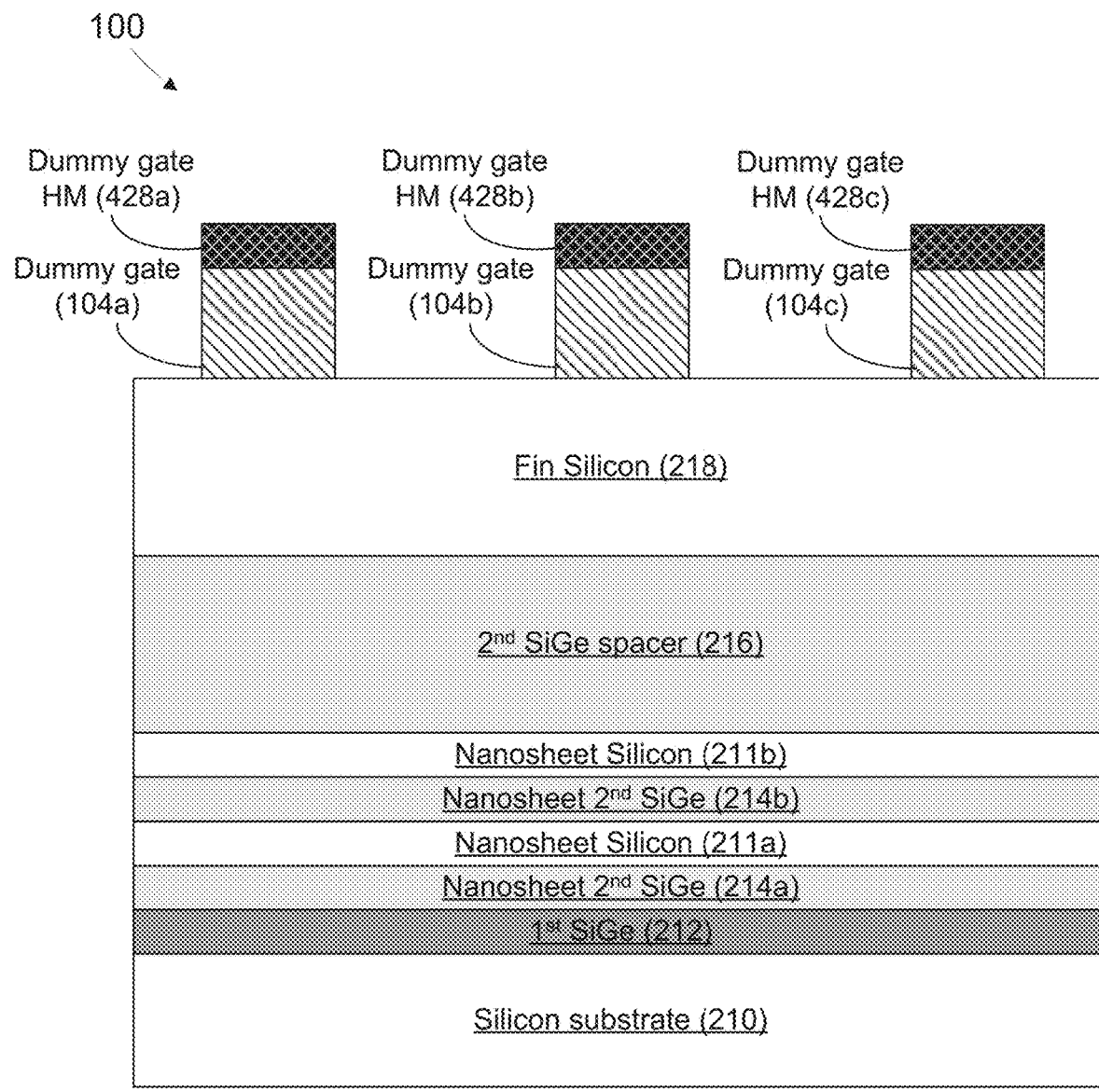
FIG. 4 illustrates a stylized X-cut cross-sectional depiction of the semiconductor device of FIGS. 3A-3E after a third stage of processing in accordance with embodiments herein.
Figure 5:
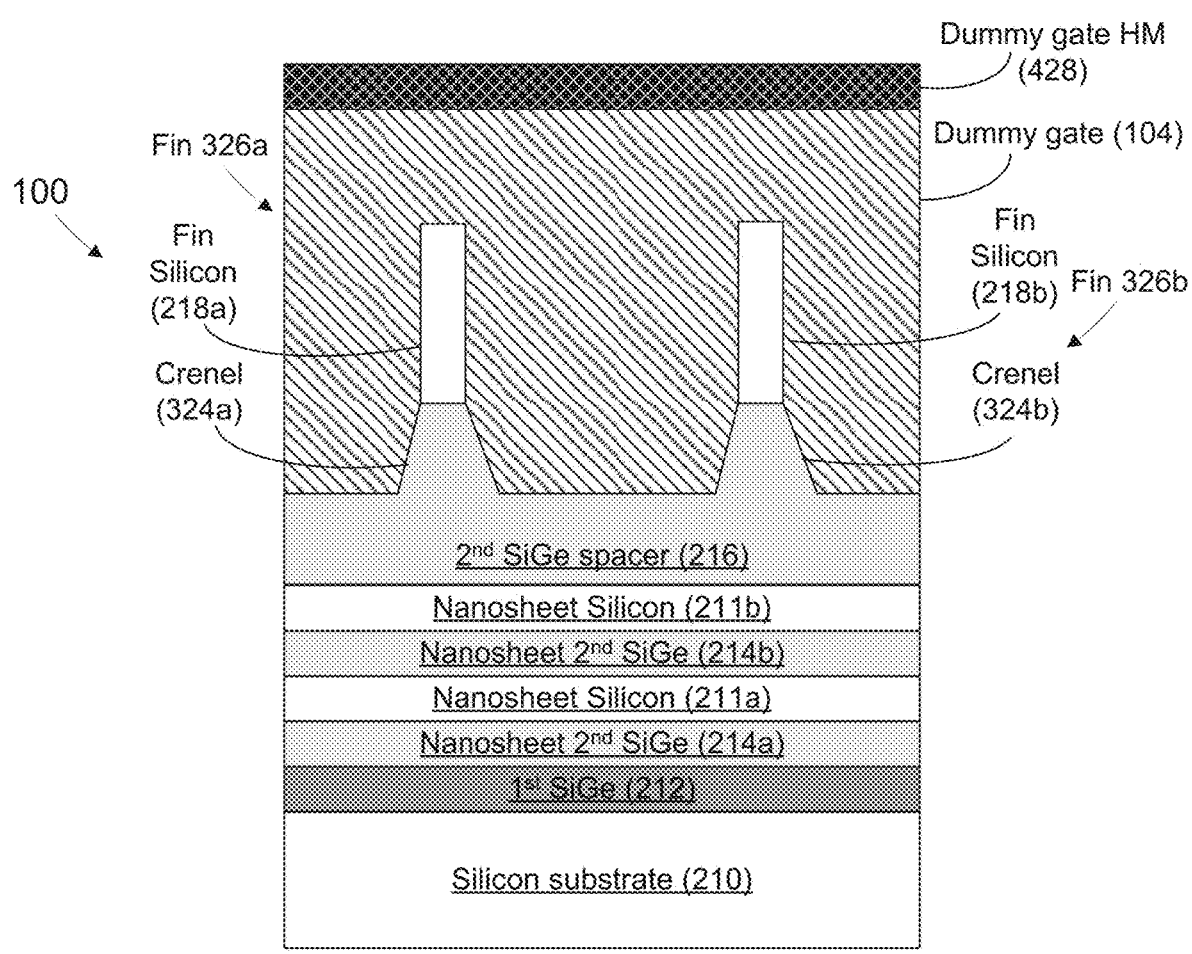
FIG. 5 illustrates a stylized Y1-cut cross-sectional depiction of the semiconductor device of FIGS. 3A-3E after the third stage of processing in accordance with embodiments herein.

FIG. 4 illustrates a stylized X-cut cross-sectional depiction and FIG. 5 illustrates a stylized Y1-cut cross-sectional depiction of the semiconductor device of FIGS. 3A-3E after a third stage of processing, in accordance with embodiments herein. In the third stage of processing, a plurality of dummy gate 104 (e.g., three dummy gates 104a, 104b, and 104c) are formed, each with a long axis perpendicular to the long axis of fins 326. In other words, the dummy gates 104a, 104b, and 104c have a long axis running into and out of the view in FIG. 4 and parallel to the view in FIG. 5. Also disposed over each dummy gate 104 is a dummy gate hard mask 428 (e.g., three dummy gate hard masks 428a, 428b, and 428c). Dummy gate formation and dummy gate hard mask formation processes are known to the person of ordinary skill in the art and need not be described in detail.

FIG. 6 illustrates a stylized X-cut cross-sectional depiction and FIG. 7 illustrates a stylized Y1-cut cross-sectional depiction of the semiconductor device of FIGS. 4-5 after a fourth stage of processing in accordance with embodiments herein. In the fourth stage of processing, the first SiGe layer 212 is removed and the spacer 106 is formed. The spacer 106 takes the place formerly occupied by the first SiGe layer 212 and also is disposed on the sidewalls (as seen in X-cut, FIG. 6) of each dummy gate 104 and dummy gate hard mask 428. The spacer 106 may include any material, such as, in one embodiment, SiOCN. The spacer 106 may provide electrical isolation between the second SiGe layer 214a and the silicon substrate 210 in the semiconductor device 100.

Figure 8:
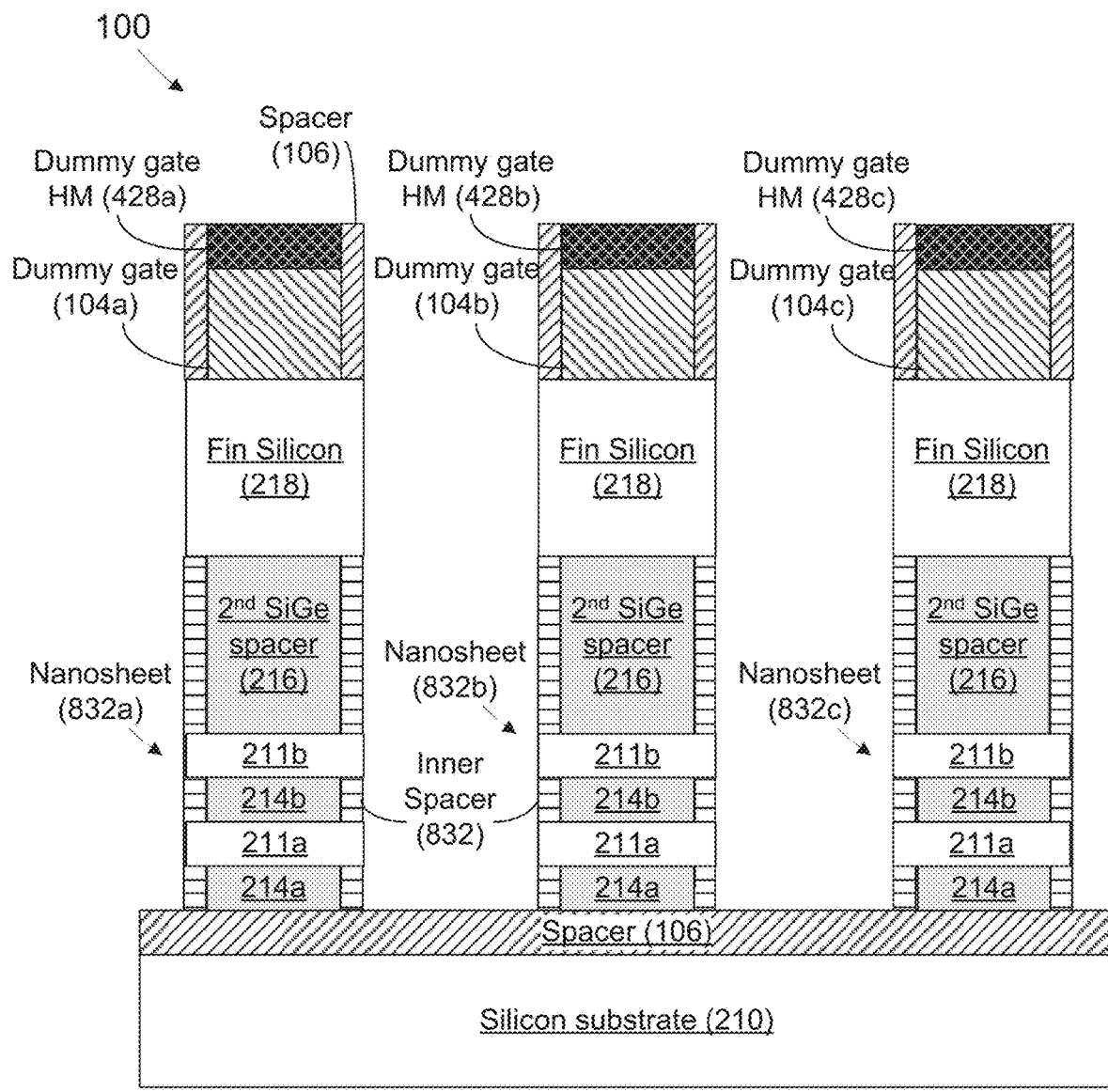
FIG. 8 illustrates a stylized X-cut cross-sectional depiction of the semiconductor device of FIGS. 6-7 after a fifth stage of processing in accordance with embodiments herein.
Figure 9:
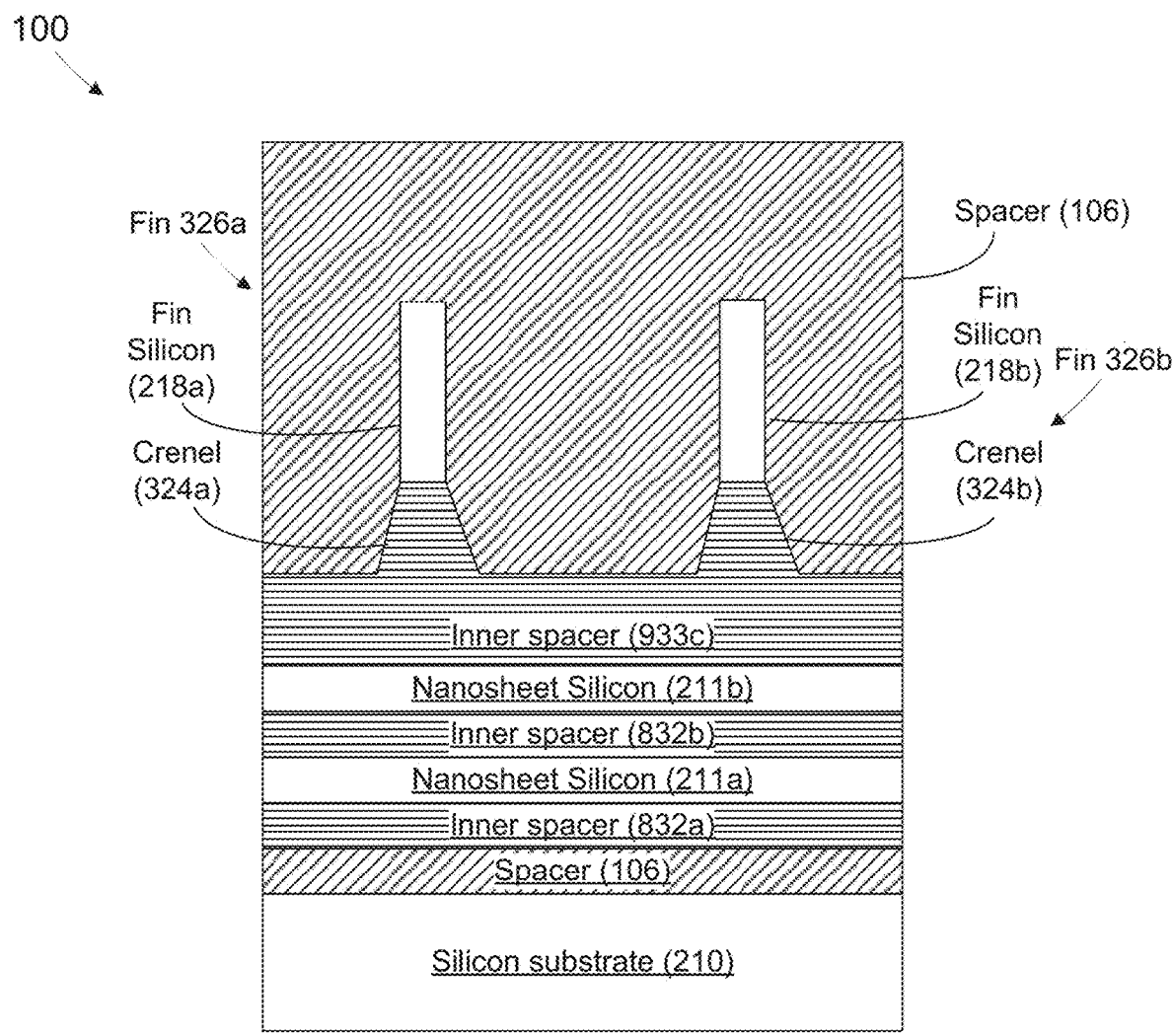
FIG. 9 illustrates a stylized Y2-cut cross-sectional depiction of the semiconductor device of FIGS. 6-7 after the fifth stage of processing in accordance with embodiments herein.

FIG. 8 illustrates a stylized X-cut cross-sectional depiction and FIG. 9 illustrates a stylized Y2-cut cross-sectional depiction of the semiconductor device of FIGS. 6-7 after a fifth stage of processing in accordance with embodiments herein. The fifth stage of processing involves a recess of fin silicon 218, second SiGe spacer 216, second SiGe layers 214, and nanosheet silicon layers 211 to form nanosheets 832, e.g. nanosheets 832a, 832b, and 832c in FIG. 8. The recess may be partially selective in that the sides of second SiGe spacer 216 and second SiGe layers 214 may be partially etched back relative to the sides of the nanosheet silicon layers 211. The fifth stage of processing also involves formation of inner spacers 832 (e.g., FIG. 9, inner spacers 832a, 832b, and 832c) in the recesses formed by the partial etch back of the sides of second SiGe spacer 216 and second SiGe layers 214.

As a reminder, the Y2-cut shown in FIG. 9 shows a cross-section through the spacer 106 on the sidewalls of a dummy gate 104. The partial etch back of the sidewalls of the second SiGe spacer 216 and the formation of the inner spacer 933c in the recess yielded by the partial etch back retains the shape of the second SiGe spacer 216, namely, the inner spacer 933c shown in FIG. 9 retains crenels 324a and 324b.

The fin silicon layers 218a, 218b may each have a height of about 40 nm, a width in X-cut view of about 25 nm, and a width in Y2-cut view of about 5 nm.

Figure 10:
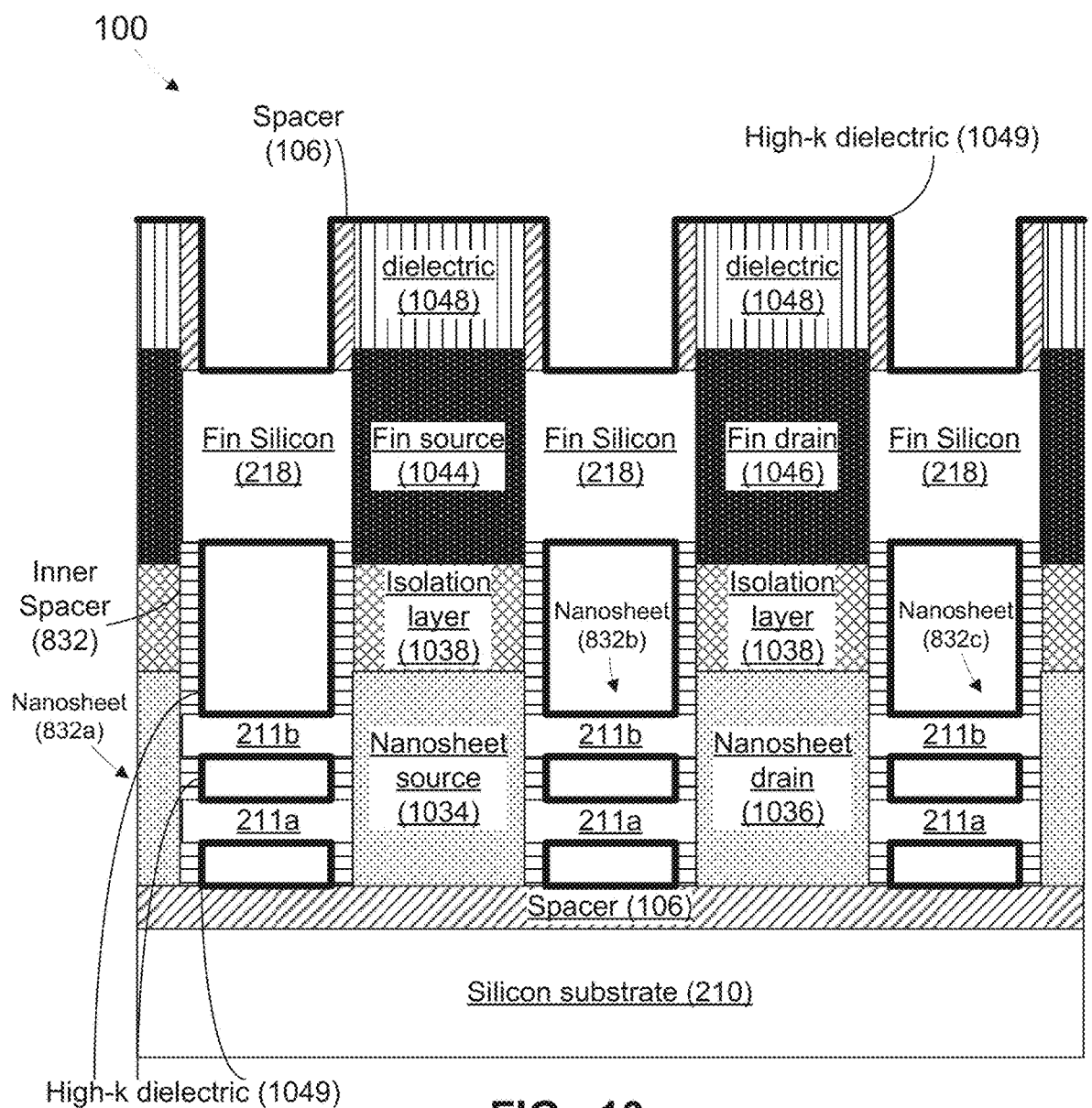
FIG. 10 illustrates a stylized X-cut cross-sectional depiction of the semiconductor device of FIGS. 8-9 after a sixth stage of processing in accordance with embodiments herein.
Figure 11:
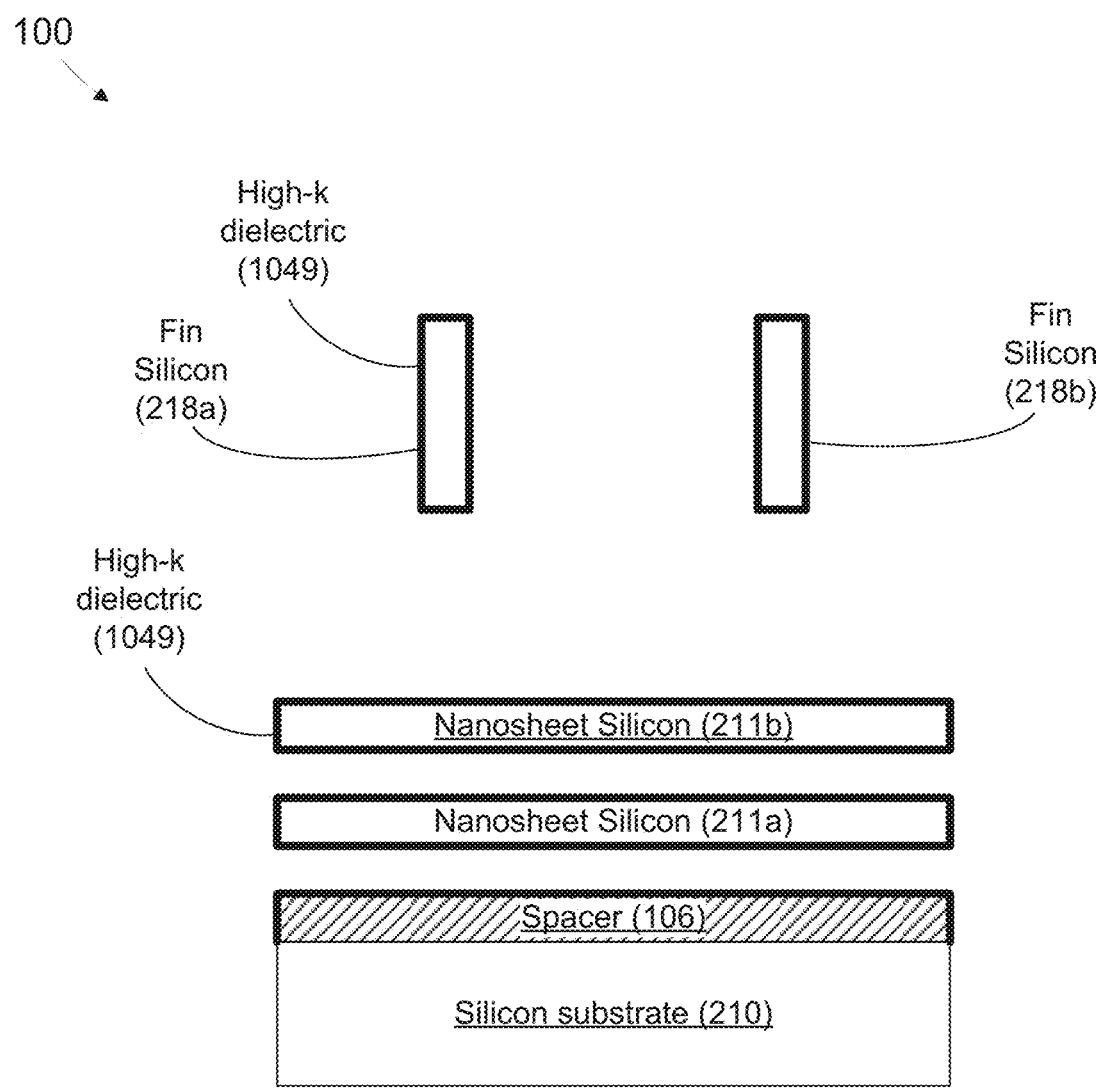
FIG. 11 illustrates a stylized Y1-cut cross-sectional depiction of the semiconductor device of FIGS. 8-9 after the sixth stage of processing in accordance with embodiments herein.

FIG. 10 illustrates a stylized X-cut cross-sectional depiction and FIG. 11 illustrates a stylized Y1-cut cross-sectional depiction of the semiconductor device of FIGS. 8-9 after a sixth stage of processing in accordance with embodiments herein. The sixth stage of processing involves several gate formation processes. A nanosheet source 1034 and a nanosheet drain 1036 are formed in the spaces between nanosheets, e.g., by epitaxial growth of source/drain material that is appropriately doped for the transistor type of the nanosheet 832a, i.e. a PFET transistor or an NFET transistor. The nanosheet silicon layers 211a and 211b provide channels between nanosheet source 1034 and nanosheet drain 1036 in a nanosheet transistor in the lower portion of the final semiconductor device 100. The epitaxial source/drain material may be grown up to the tops of the spacer 106 (or overgrown and planarized via CMP). The epitaxial source/drain material may then be recessed using known techniques to yield the nanosheet source 1034 and nanosheet drain 1036 shown in FIG. 10. The nanosheet source 1034 is formed between nanosheets 832a and 832b, and the nanosheet drain 1036 is formed between nanosheets 832b and 832c.

Continuing an exemplary embodiment of the sixth stage of processing, atop the nanosheet source 1034 and the nanosheet drain 1036 are formed dielectric isolation layers 1038. Subsequently, a fin source 1044 and a fin drain 1046 are each formed on a dielectric isolation layer 1038. The fin silicon layers 218 provide channels between fin source 1044 and fin drain 1046 in a fin transistor in the upper portion of the final semiconductor device 100. The fin source 1044 and the fin drain 1046 may be formed by epitaxial growth of source/drain material that is appropriately doped for the transistor type of the fin transistors, which is typically the opposite type of the nanosheet transistors. The dielectric isolation layers 1038 provide electrical isolation between nanosheet and fin sources and drains 1034-1044 and 1036-1046.

The nanosheet source/drain 1034 and 1036 are of a first type, wherein the first type is appropriate for a PFET transistor or an NFET transistor. For example, the nanosheet source/drain 1034 and 1036 may be formed of epitaxial silicon doped with a P-type dopant. The fin source/drain 1044 and 1046 are of a second type, wherein the second type is appropriate for a PFET transistor or an NFET transistor, and the second type is different from the first type. Continuing the example, the fin source/drain 1044 and 1046 may be formed of epitaxial silicon doped with an N-type dopant.

The sixth stage of processing also involves formation of a dielectric 1048, which may be silicon oxide, over the fin source 1044 and the fin drain 1046; removal of the dummy gate hard mask 428 and the dummy gate 104; and removal of the second SiGe layers 214 and the second SiGe spacer 216 while retaining nanosheet silicon layers 211a and 211b and fin silicon layers 218.

Finally, in embodiments, the sixth stage of processing may involve formation of a high-k dielectric 1049, such as hafnium oxide, along surfaces exposed by removal of the first SiGe layers 214, the second SiGe spacer 216, the dummy gate hard mask 428, and the dummy gate 104.

Figure 12:
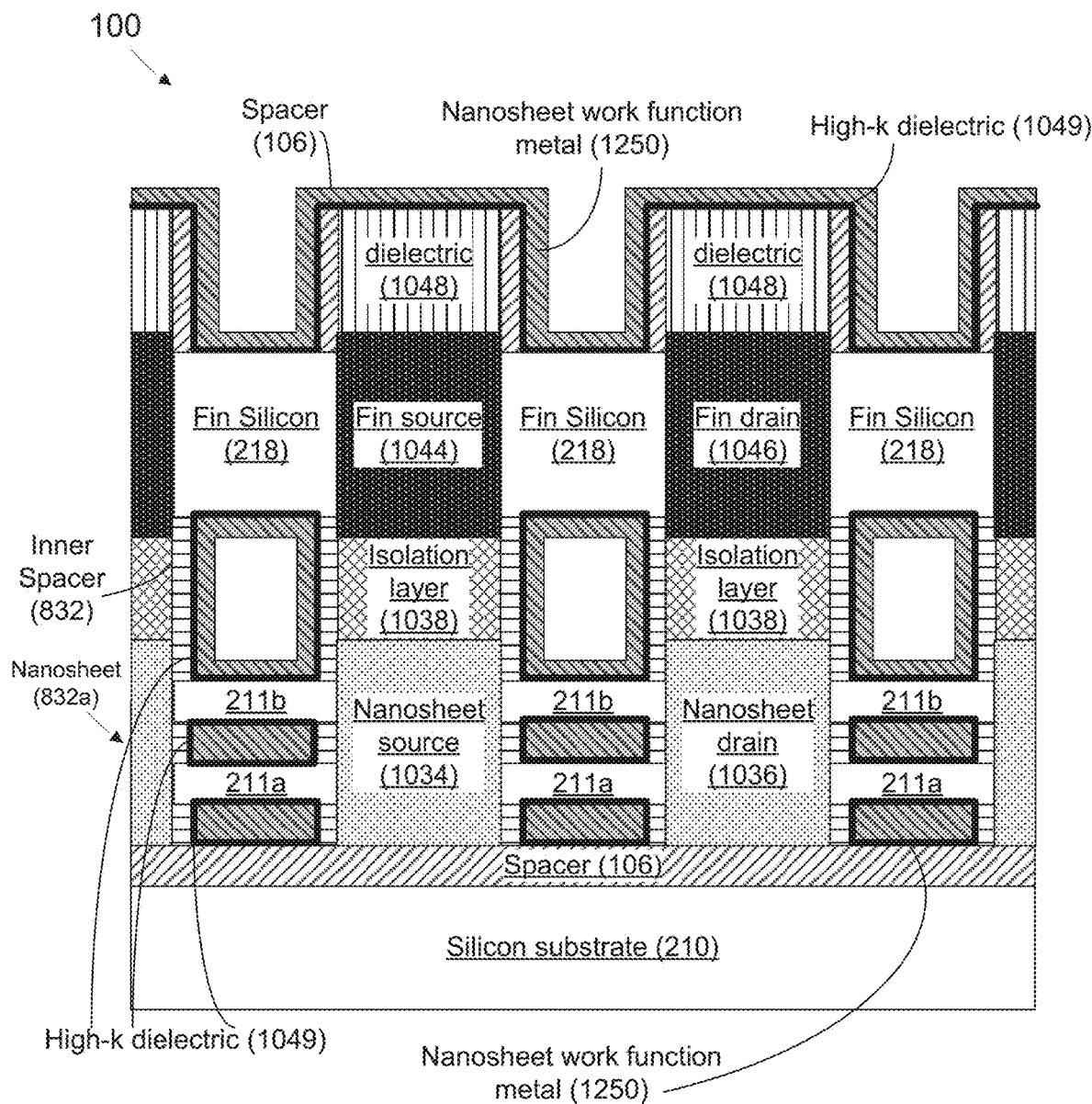
FIG. 12 illustrates a stylized X-cut cross-sectional depiction of the semiconductor device of FIGS. 10-11 after a seventh stage of processing in accordance with embodiments herein.
Figure 13:
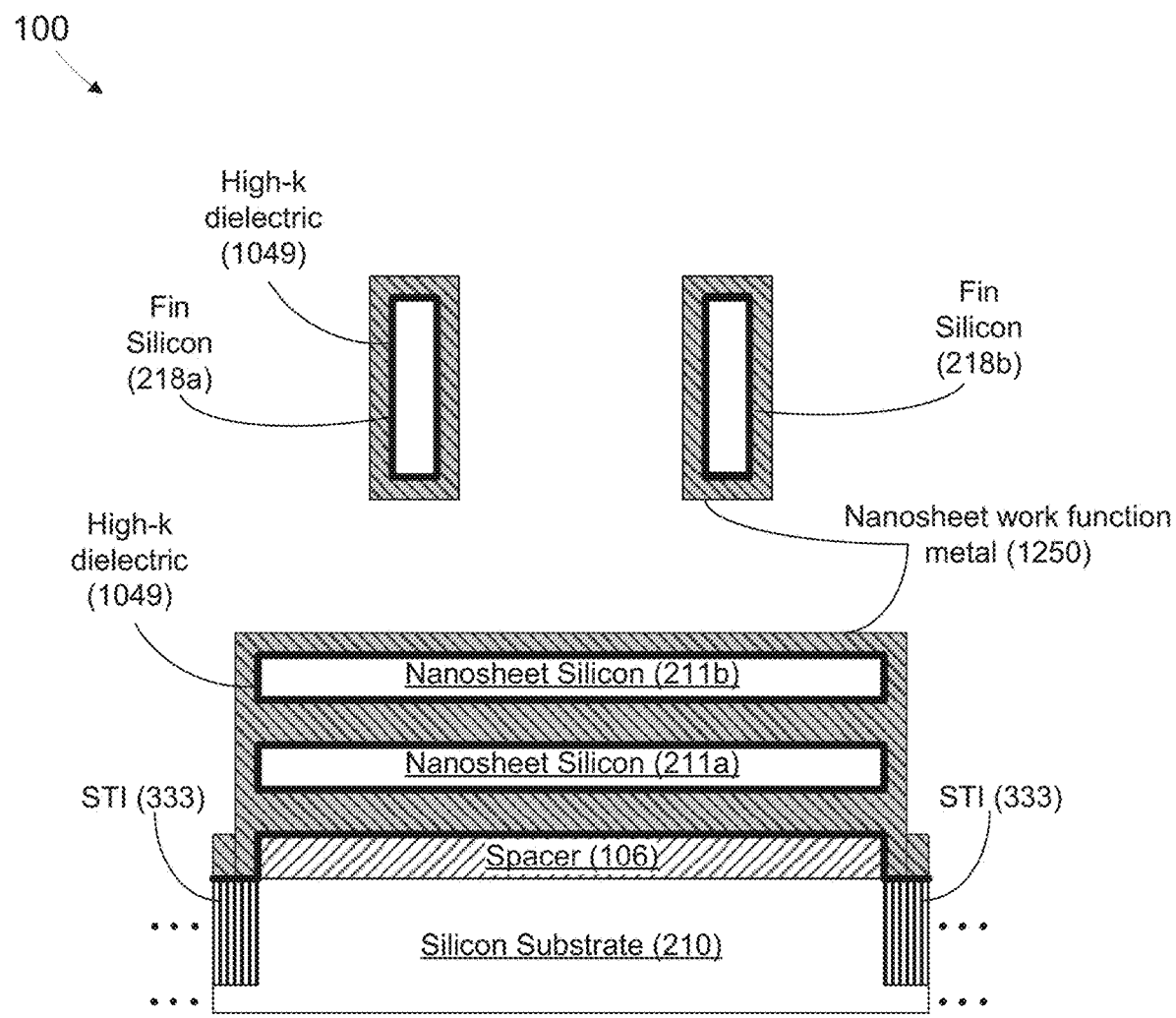
FIG. 13 illustrates a stylized extended Y1-cut cross-sectional depiction of the semiconductor device of FIGS. 10-11 after the seventh stage of processing in accordance with embodiments herein.

FIG. 12 illustrates a stylized X-cut cross-sectional depiction and FIG. 13 illustrates a stylized extended Y1-cut cross-sectional depiction of the semiconductor device of FIGS. 10-11 after a seventh stage of processing in accordance with embodiments herein. In the seventh stage of processing, a nanosheet work function metal (WFM) 1250, i.e., a work function metal suitable for use in nanosheet transistors doped with the dopant used in the nanosheet source 1034 and nanosheet drain 1036, is deposited over the semiconductor device 100. Conditions for deposition of the nanosheet WFM 1250 may be chosen such that the nanosheet WFM 1250 fills the gaps formerly occupied by the second SiGe layers 214 and partially lines the gaps formerly occupied by second SiGe spacer 216 and the dummy gate/dummy gate hard mask 104/428. As shown in FIG. 13, the nanosheet work function metal 1250 surrounds in Y1-cut cross-section the nanosheet silicon layers 211a, 211b. (To indicate this point, the nanosheet work function metal 1250 extends laterally beyond the boundary depicted in FIG. 1. Portions of the STI 333 last shown in FIG. 3E and the silicon substrate 210 extending laterally beyond the boundary are shown and their continued extension is indicated each by an ellipsis in FIGS. 13, 15, 17, 19, and 21).

Figure 14:
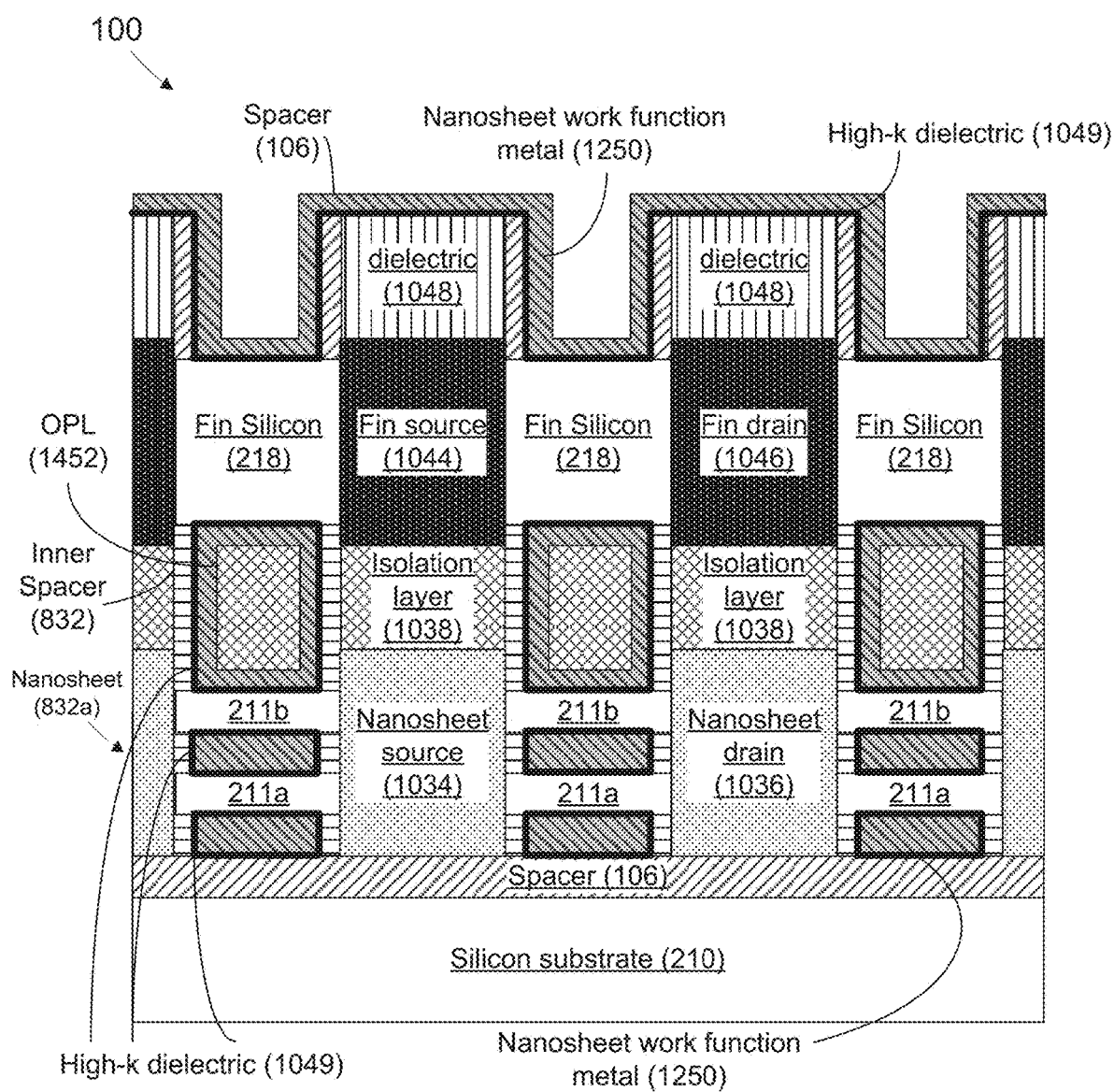
FIG. 14 illustrates a stylized X-cut cross-sectional depiction of the semiconductor device of FIGS. 12-13 after an eighth stage of processing in accordance with embodiments herein.
Figure 15:
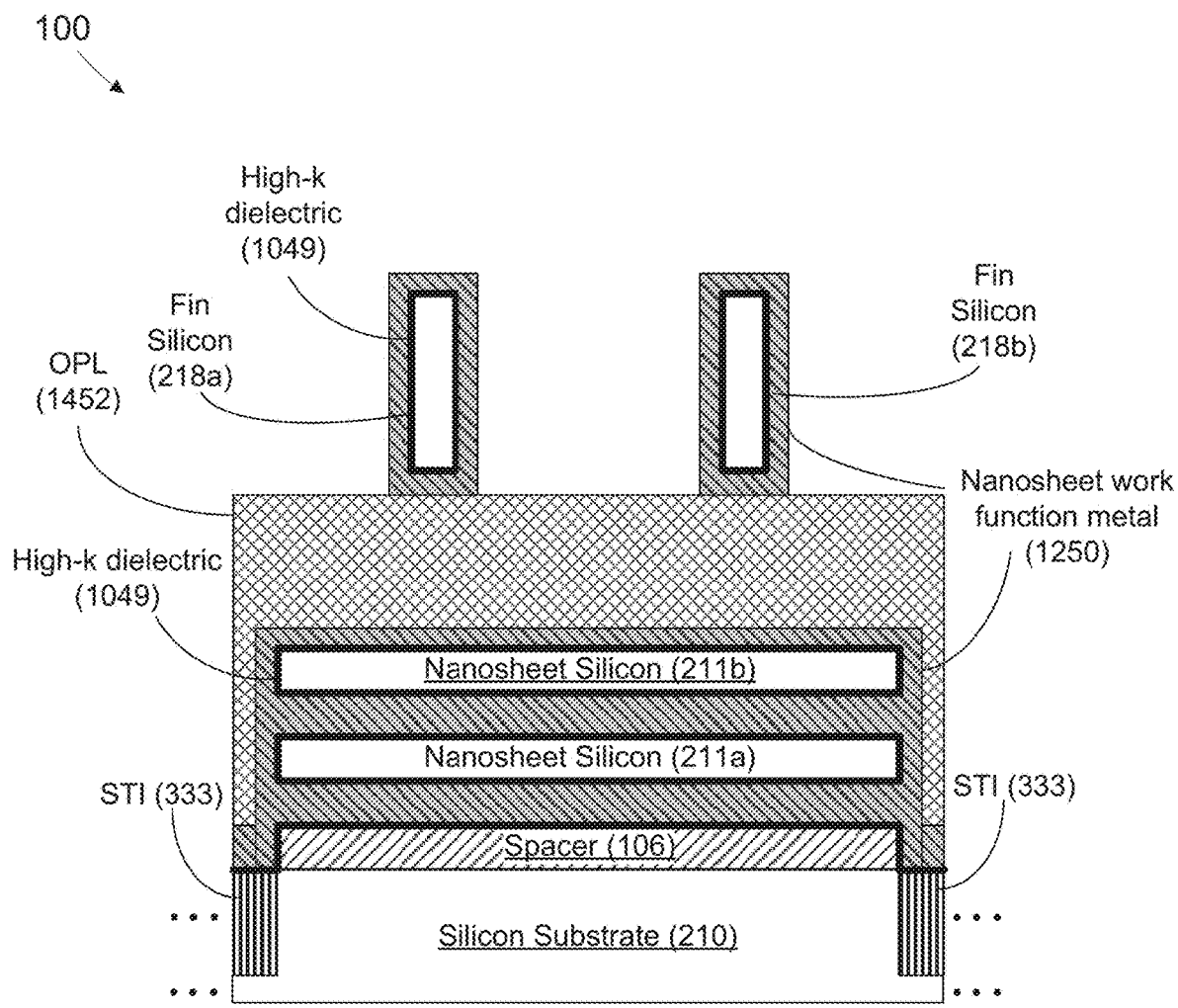
FIG. 15 illustrates a stylized extended Y1-cross-sectional depiction of the semiconductor device of FIGS. 12-13 after the eighth stage of processing in accordance with embodiments herein.

FIG. 14 illustrates a stylized X-cut cross-sectional depiction and FIG. 15 illustrates a stylized Y1-cut cross-sectional depiction of the semiconductor device of FIGS. 12-13 after an eighth stage of processing in accordance with embodiments herein. In the eighth stage of processing, an organic polymerization layer (OPL) 1452 is formed. In one embodiment, the OPL 1452 is overfilled, such as by spin-coating, followed by planarization, such as by multiple coating and etching cycles, followed by recession. The eight stage of processing yields the OPL 1452 deposited in the voids formerly occupied by the second SiGe spacer 216 and lined with the nanosheet WFM 1250.

Figure 16:
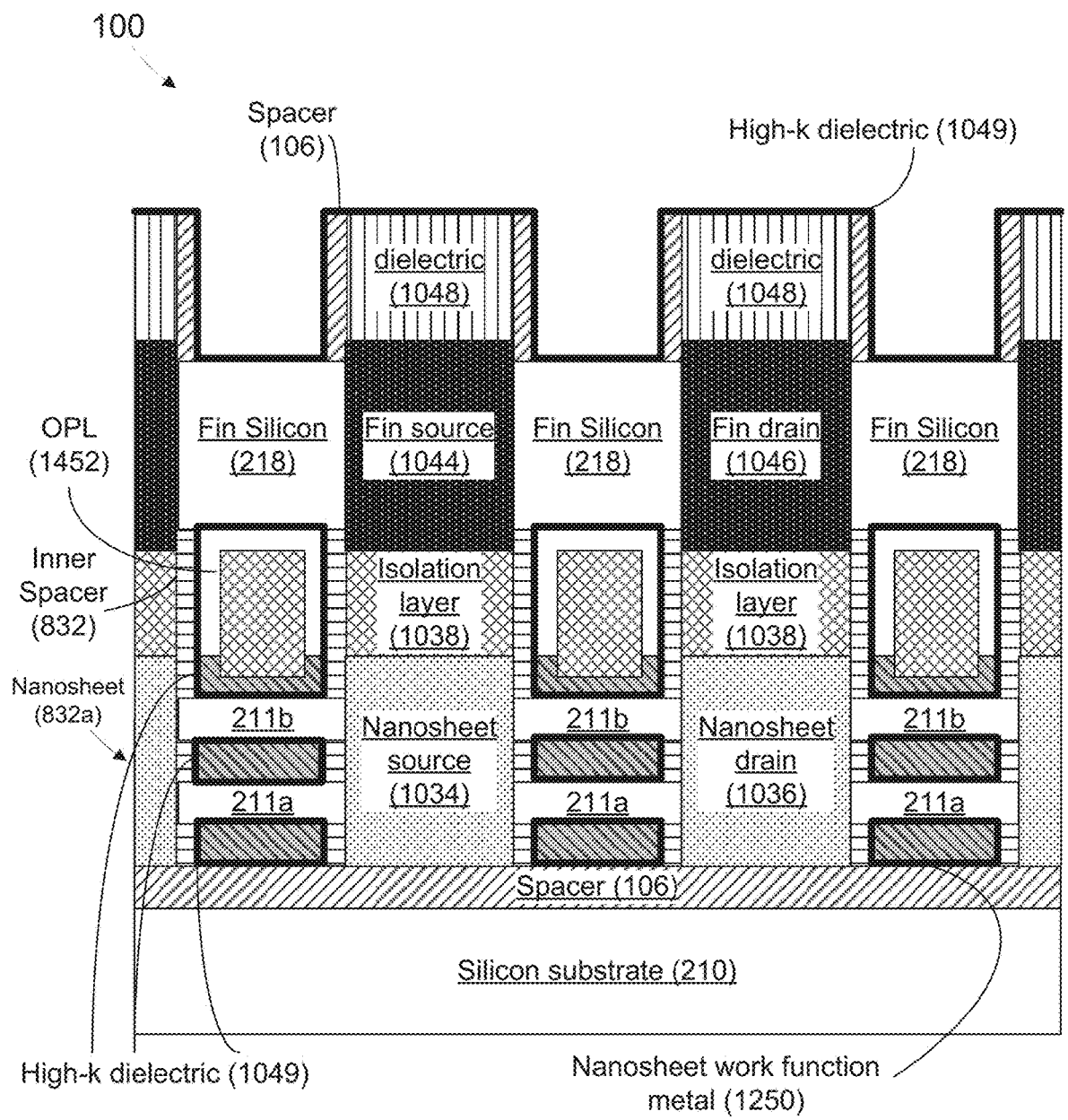
FIG. 16 illustrates a stylized X-cut cross-sectional depiction of the semiconductor device of FIGS. 14-15 after a ninth stage of processing in accordance with embodiments herein.
Figure 17:
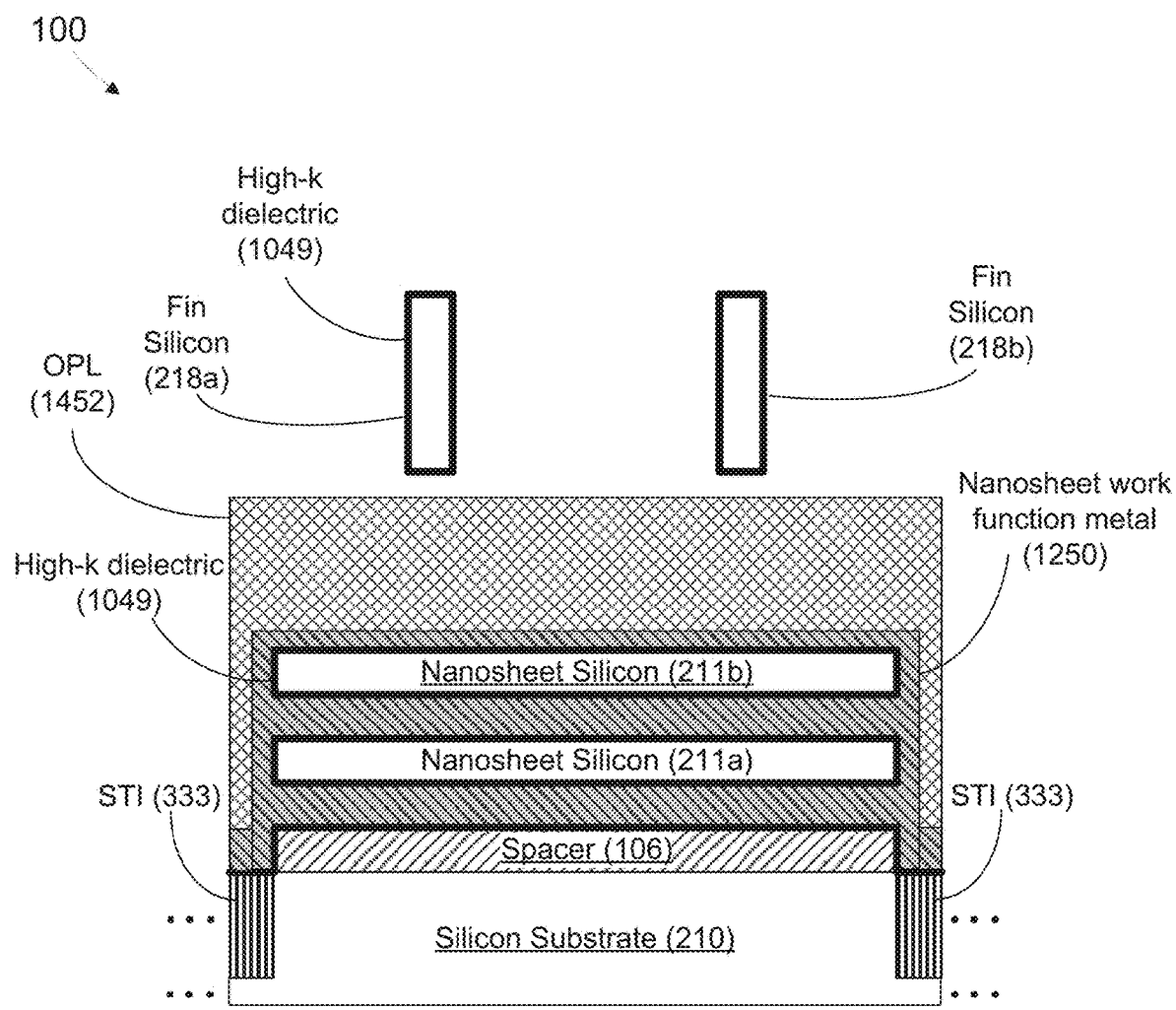
FIG. 17 illustrates a stylized extended Y1-cross-sectional depiction of the semiconductor device of FIGS. 14-15 after the ninth stage of processing in accordance with embodiments herein.

FIG. 16 illustrates a stylized X-cut cross-sectional depiction and FIG. 17 illustrates a stylized Y1-cut cross-sectional depiction of the semiconductor device of FIGS. 14-15 after a ninth stage of processing in accordance with embodiments herein. In the ninth stage of processing, the nanosheet WFM 1250 is removed from around the fin silicon 218. Removal of the nanosheet WFM 1250 may involve an isotropic etch of the nanosheet WFM 1250 above the fin silicon layers 218 and from an upper portion of the spaces filled with OPL 1452 in the view of FIG. 16. The relatively large separation between fin silicon 218 and uppermost nanosheet silicon layer 211b, which was imparted by the relatively large height difference between second SiGe spacer 216 and uppermost nanosheet silicon layer 211b, allows a relatively small undercut, and minimizes the removal of nanosheet WFM 1250 from around the uppermost nanosheet silicon layer 211b.

Figure 18:
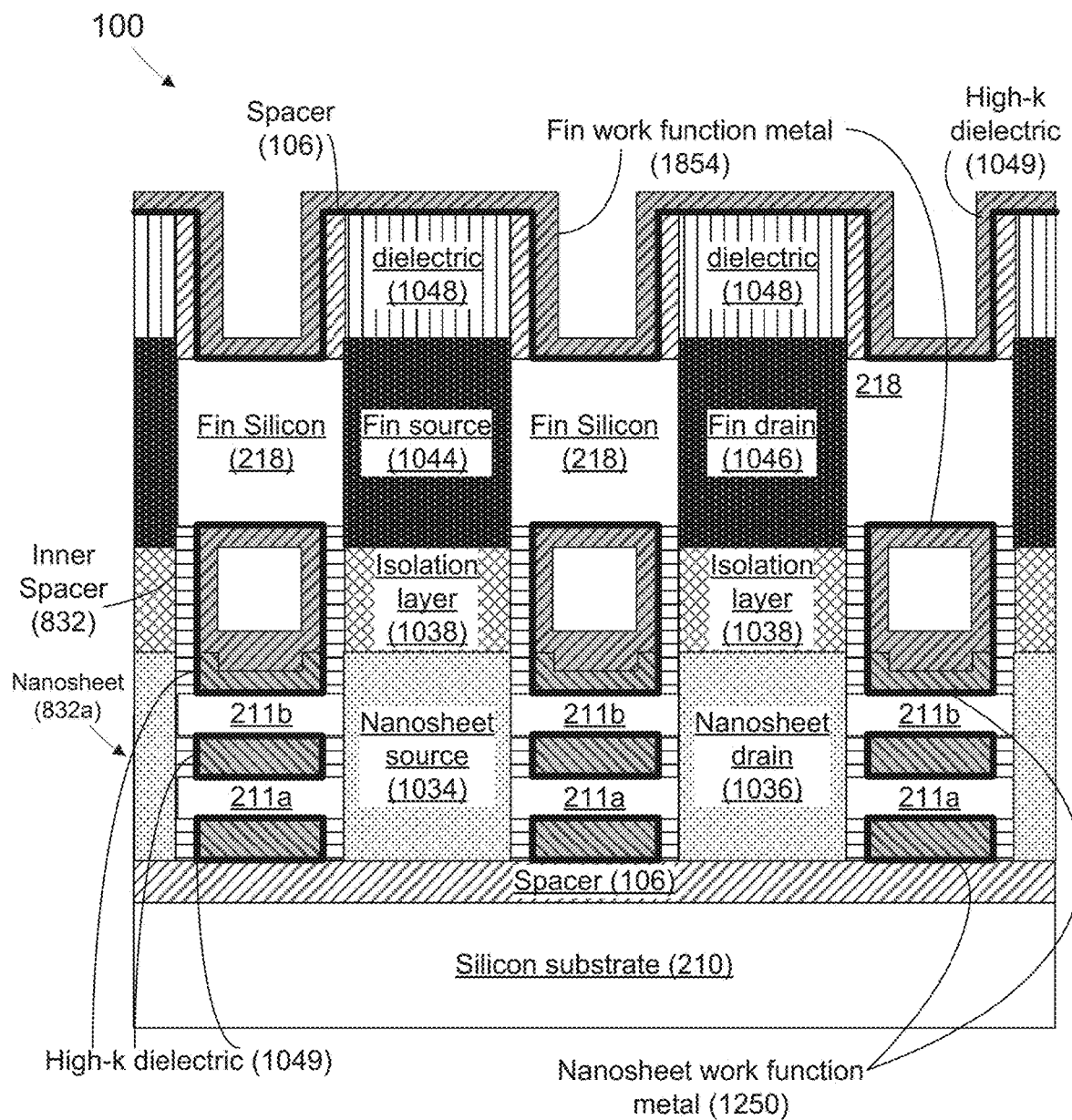
FIG. 18 illustrates a stylized X-cut cross-sectional depiction of the semiconductor device of FIGS. 16-17 after a tenth stage of processing in accordance with embodiments herein.
Figure 19:
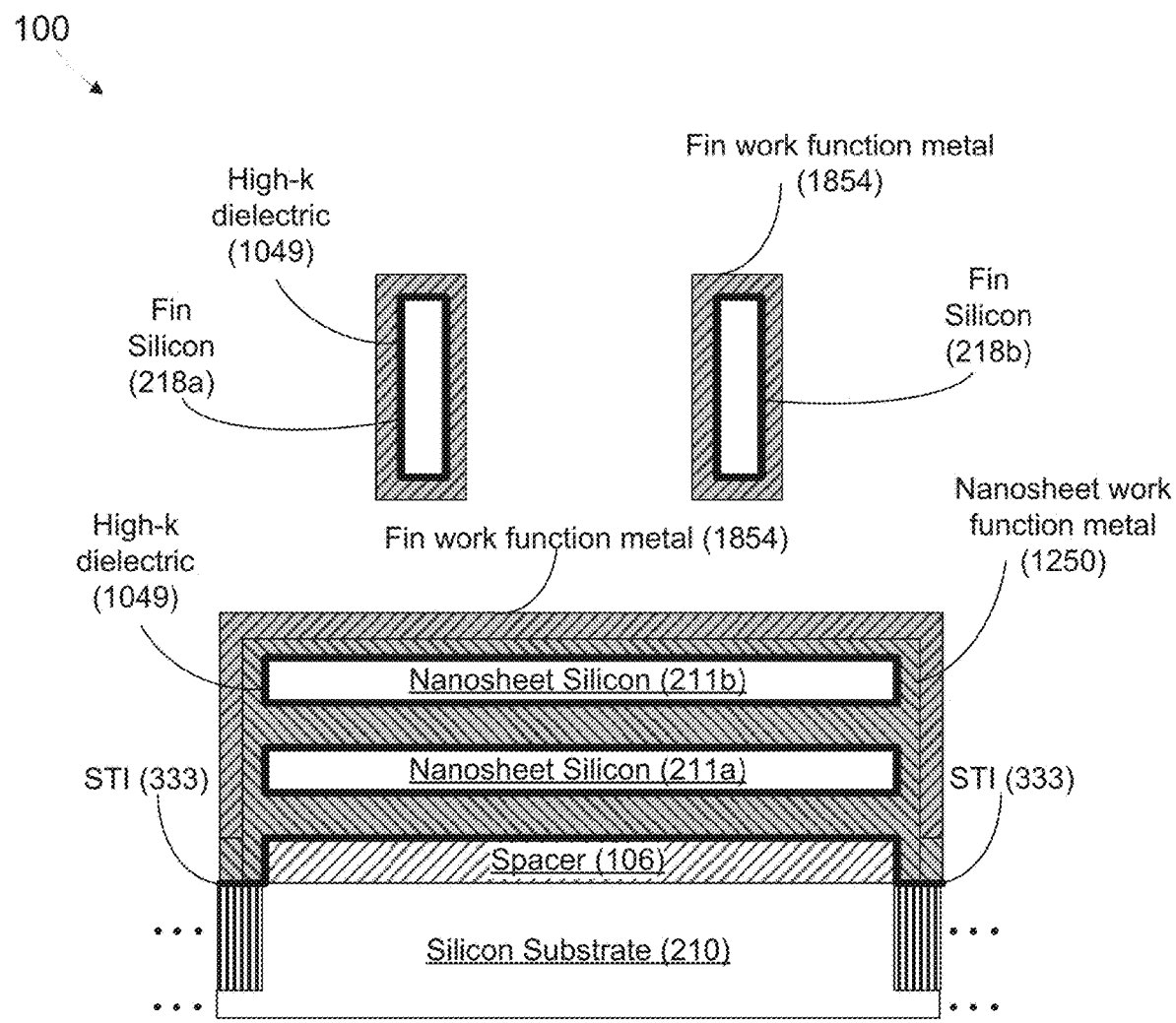
FIG. 19 illustrates a stylized extended Y1-cross-sectional depiction of the semiconductor device of FIGS. 16-17 after the tenth stage of processing in accordance with embodiments herein.

FIG. 18 illustrates a stylized X-cut cross-sectional depiction and FIG. 19 illustrates a stylized Y1-cut cross-sectional depiction of the semiconductor device of FIGS. 16-17 after a tenth stage of processing in accordance with embodiments herein. In the tenth stage of processing, the OPL 1452 is removed and a fin WFM 1854 is deposited to line the voids formerly occupied by the second SiGe spacer 216 and the dummy gate/dummy gate hard mask 104/428.

Figure 20:
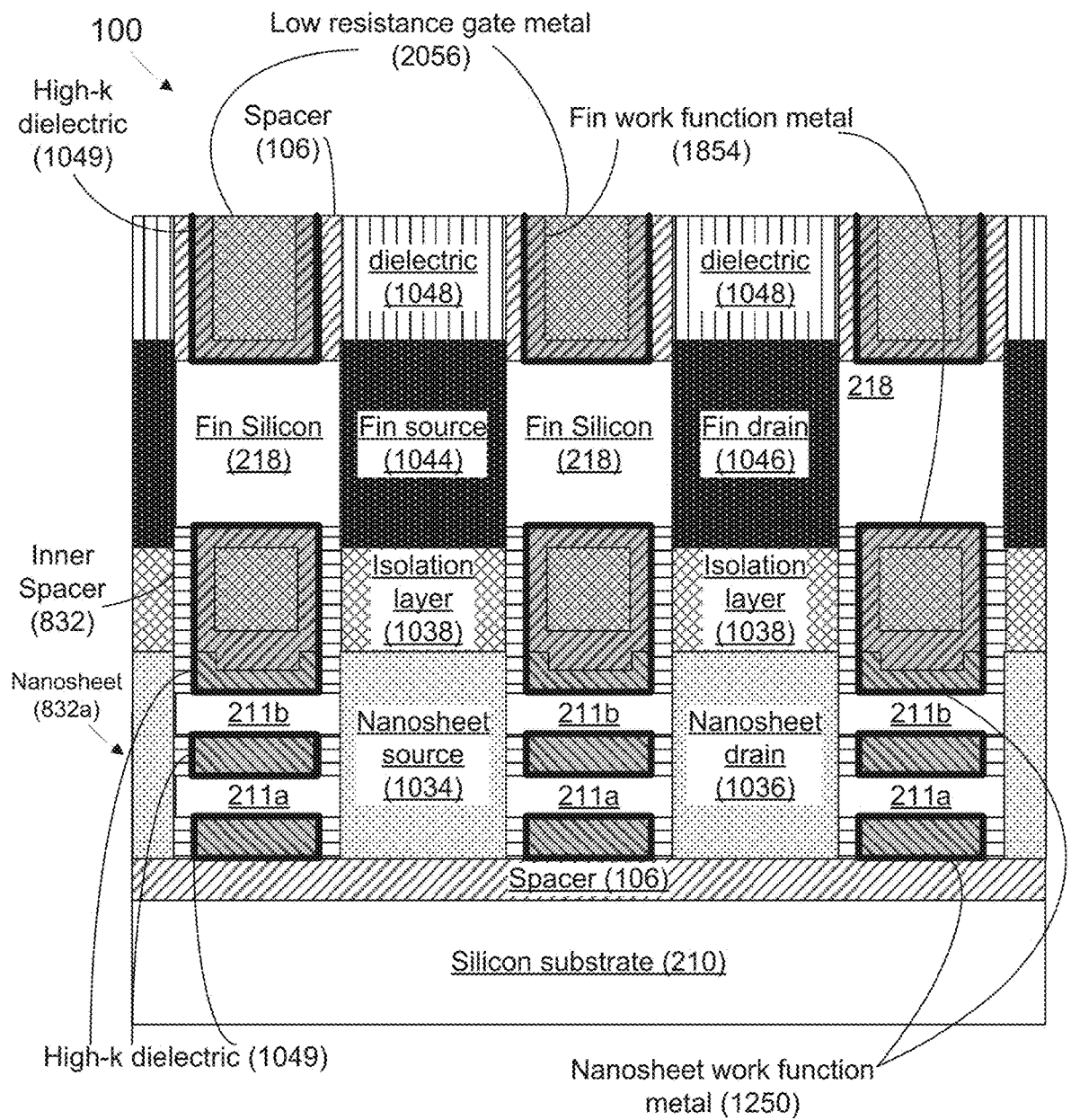
FIG. 20 illustrates a stylized X-cut cross-sectional depiction of the semiconductor device of FIGS. 18-19 after an eleventh stage of processing in accordance with embodiments herein.
Figure 21:
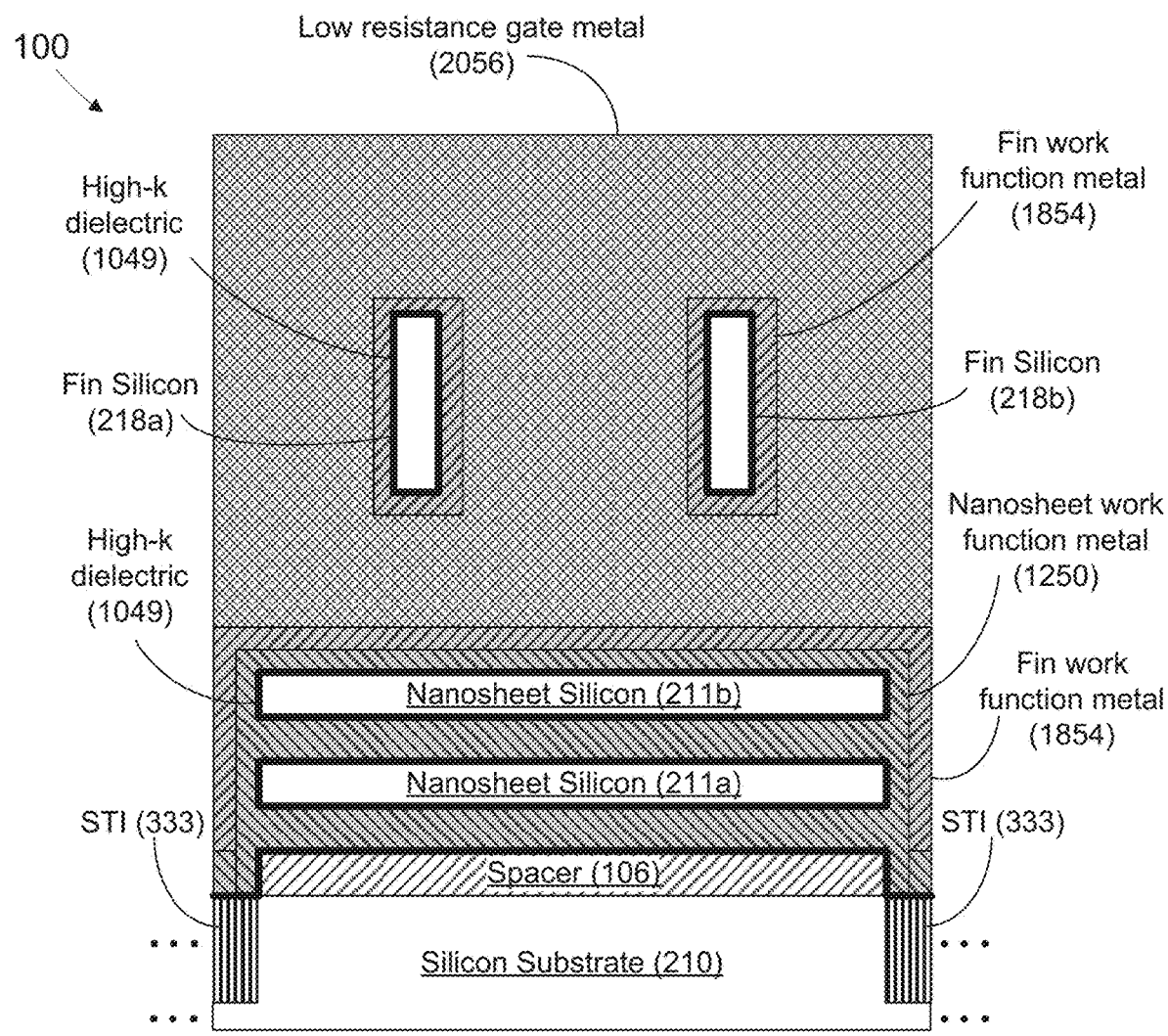
FIG. 21 illustrates a stylized extended Y1-cross-sectional depiction of the semiconductor device of FIGS. 18-19 after the eleventh stage of processing in accordance with embodiments herein.

FIG. 20 illustrates a stylized X-cut cross-sectional depiction and FIG. 21 illustrates a stylized Y1-cut cross-sectional depiction of the semiconductor device of FIGS. 18-19 after an eleventh stage of processing in accordance with embodiments herein. The eleventh stage of processing involves the formation of low resistance gate metal 2056 over the nanosheet WFM 1250 and the fin WFM 1854. By "low resistance" is meant that the metal 2056 has a lower resistance than the fin WFM 1854. The low resistance gate metal 2056 may be formed of any suitable material. In one embodiment, the low resistance gate metal 2056 is formed of tungsten. The low resistance gate metal 2056 may be formed by overfilling the various voids in semiconductor device 100 and performing chemical-mechanical polishing (CMP) to planarize the tops of the low resistance gate metal 2056 to the tops of the dielectric 1048 and the spacer 106.

Subsequently, one or more further processing stages known to the person of ordinary skill in the art (not shown) may be performed to yield a final semiconductor device 100 suitable for use in one or more applications.

Figure 22:
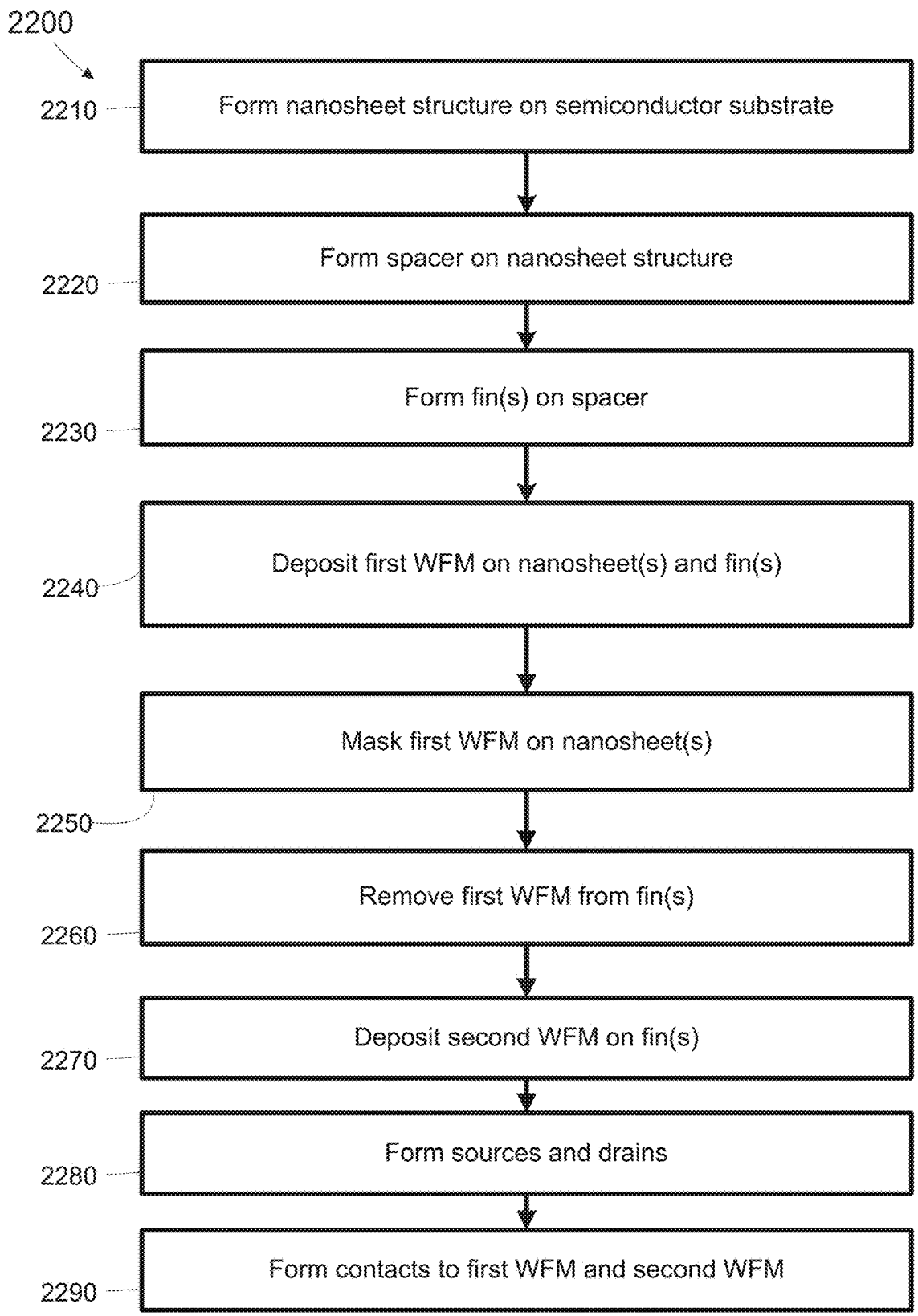
FIG. 22 illustrates a flowchart of a method in accordance with embodiments herein.

FIG. 22 illustrates a flowchart of a method 2200 in accordance with embodiments herein. The method 2200 involves forming (at 2210) a nanosheet structure on a semiconductor substrate, wherein the nanosheet structure contains at least one first channel wider in one cross-section than tall. In one embodiment, forming the nanosheet structure (at 2210) includes forming a first plurality of the first channels. Forming the nanosheet structure (at 2210) may involve forming each first channel from silicon.

The method 2200 also involves forming (at 2220) a spacer on the nanosheet structure. Forming the spacer (at 2220) may involve forming the spacer from silicon-germanium. In one embodiment, forming the spacer (at 2220) contains forming at least one crenel on the spacer.

The method 2200 also includes forming (at 2230) at least one fin on the spacer, wherein each fin includes a second channel taller in the one cross-section than wide. Forming the at least one fin (at 2230) may involve forming each second channel from silicon.

In one embodiment, forming the at least one fin (at 2230) includes forming a second plurality of the second channels. The first plurality of first channels and the second plurality of second channels may be equal in value or may vary, e.g., there may be more, the same number, or fewer.

In one embodiment, wherein forming the spacer (at 2220) involved forming at least one crenel on the spacer, forming the at least one fin (at 2230) contains forming the at least one fin on one crenel.

The method 2200 also involves depositing (at 2240) a first work function metal (WFM) of a first type on a top and on at least two opposite sides of each first channel and each second channel, wherein the first type is a PFET WFM or an NFET WFM. The method 2200 also includes masking (at 2250) the first WFM on each first channel, followed by removing (at 2260) the first WFM from each second channel.

The method 2200 additionally includes depositing (at 2270) a second WFM of a second type on a top and on at least two opposite sides of each second channel, wherein the second type is a PFET WFM or an NFET WFM, and the second type is different from the first type.

In some embodiments, the method 2200 may include forming (at 2280) a first source on one side of the nanosheet structure and a first drain on a second side of the nanosheet structure, and a second source on one side of each fin and a second drain on a second side of each fin, prior to depositing the first WFM. In one embodiment, the first source and the second source are formed in vertical alignment, and the first drain and the second drain are formed in vertical alignment.

In an additional embodiment, the method 2200 may include forming (at 2290) contacts to the first WFM and the second WFM.

Figure 23:
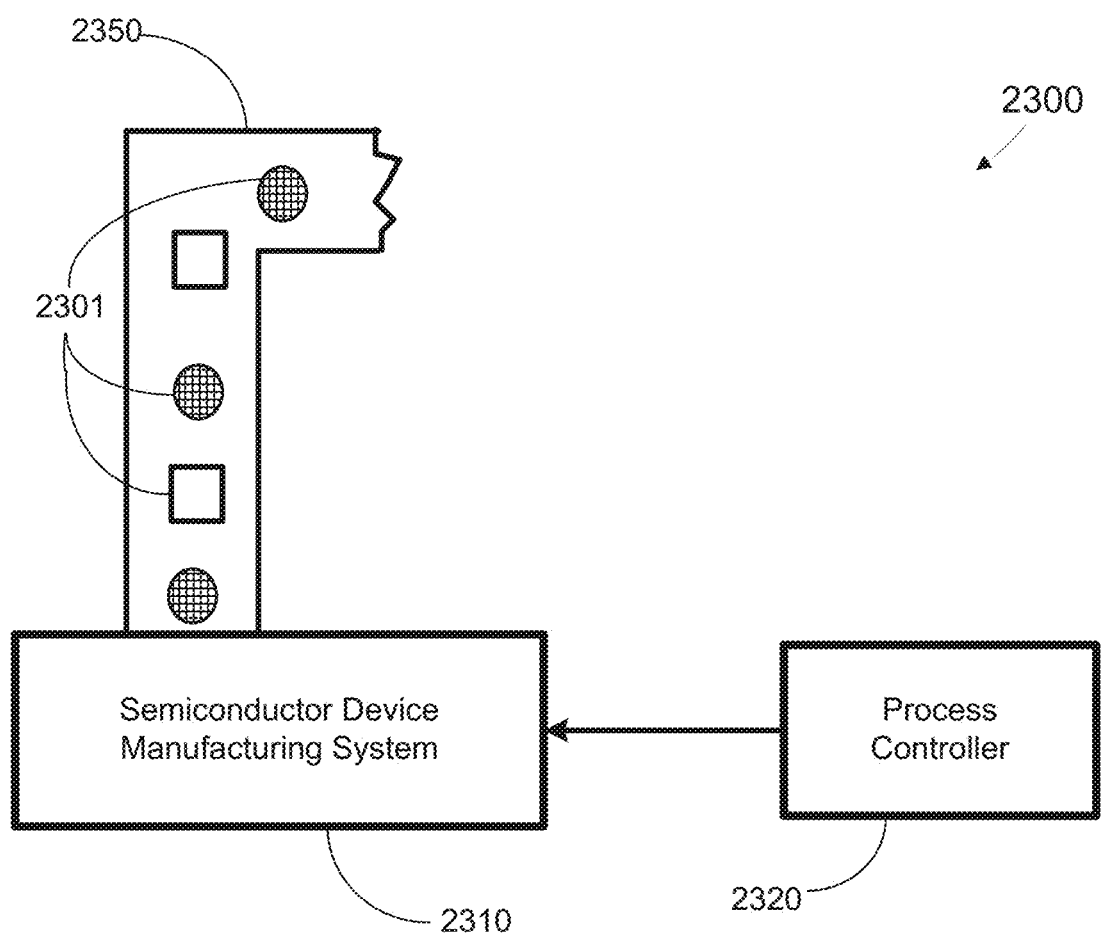
FIG. 23 illustrates a semiconductor device manufacturing system for manufacturing a device in accordance with embodiments herein.

Turning now to FIG. 23, a stylized depiction of a system for fabricating a semiconductor device 100, in accordance with embodiments herein, is illustrated. The system 2300 of FIG. 23 may contain a semiconductor device manufacturing system 2310 and a process controller 2320. The semiconductor device manufacturing system 2310 may manufacture semiconductor devices based upon one or more instruction sets provided by the process controller 2320. In one embodiment, a first instruction set may include instructions to provide a semiconductor structure containing at least one first transistor of a first type disposed above a substrate and containing a channel wider in one cross-section than tall, wherein the first type is a PFET transistor or an NFET transistor; and at least one second transistor of a second type disposed above the at least one first transistor and including a channel taller in the one cross-section than wide, wherein the second type is a PFET transistor or an NFET transistor, and the second type is different from the first type.

The first instruction set may include instructions to form a nanosheet structure on a semiconductor substrate, wherein the nanosheet structure contains at least one first channel wider in one cross-section than tall; form a spacer on the nanosheet structure; form at least one fin on the spacer, wherein each fin contains a second channel taller in the one cross-section than wide; deposit a first work function metal (WFM) of a first type on a top and on at least two opposite sides of each first channel and each second channel, wherein the first type is a PFET WFM or an NFET WFM; mask the first WFM on each first channel; remove the first WFM from each second channel; and deposit a second WFM of a second type on a top and on at least two opposite sides of each second channel, wherein the second type is a PFET WFM or an NFET WFM, and the second type is different from the first type.

The semiconductor device manufacturing system 2310 may include various processing stations, such as etch process stations, photolithography process stations, CMP process stations, etc. One or more of the processing steps performed by the semiconductor device manufacturing system 2310 may be controlled by the process controller 2320. The process controller 2320 may be a workstation computer, a desktop computer, a laptop computer, a tablet computer, or any other type of computing device containing one or more software products that are capable of controlling processes, receiving process feedback, receiving test results data, performing learning cycle adjustments, performing process adjustments, etc.

The semiconductor device manufacturing system 2310 may produce semiconductor devices 2301 (e.g., integrated circuits) on a medium, such as silicon wafers. The semiconductor device manufacturing system 2310 may provide processed semiconductor devices 2301 on a transport mechanism 2350, such as a conveyor system. In some embodiments, the conveyor system may be sophisticated clean room transport systems that are capable of transporting semiconductor wafers. In one embodiment, the semiconductor device manufacturing system 2310 may contain a plurality of processing steps, e.g., the $1^{st}$ process step, the $2^{nd}$ process step, etc.

In some embodiments, the items labeled "2301" may represent individual wafers, and in other embodiments, the items 2301 may represent a group of semiconductor wafers, e.g., a "lot" of semiconductor wafers. The semiconductor device 2301 may include one or more of a transistor, a capacitor, a resistor, a memory cell, a processor, and/or the like.

The system 2300 may be capable of manufacturing various products involving various technologies. For example, the system 2300 may produce devices of CMOS technology, Flash technology, BiCMOS technology, power devices, memory devices (e.g., DRAM devices), NAND memory devices, and/or various other semiconductor technologies.

The methods described above may be governed by instructions that are stored in a non-transitory computer readable storage medium and that are executed by, e.g., a processor in a computing device. Each of the operations described herein may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
   at least one first transistor of a first type disposed above a substrate and comprising (i) a channel having a first width and a first height in a cross-section of the semiconductor device, wherein the first width is greater than the first height, and (ii) a first source and a first drain; and
   at least one second transistor of a second type disposed directly above the at least one first transistor and comprising (i) a channel having a second width and a second height in the cross-section, wherein the second height is greater than the second width, and (ii) a second source and a second drain; wherein the second source is vertically aligned with the first source, the second drain is vertically aligned with the first drain, and the second type is different from the first type;
   an isolation layer disposed between the first source and the second source, and disposed between the first drain and the second drain; and
   a spacer between the channel of the at least one first transistor and the channel of the at least one second transistor, wherein the spacer comprises at least one crenel.

2. The semiconductor device of claim 1, wherein the channels of the at least one first transistor and the at least one second transistor comprise silicon.

3. The semiconductor device of claim 1, wherein the spacer has a height at least four times the first height of the channel of the at least one first transistor and four times the second width of the channel of the at least one second transistor.

4. The semiconductor device of claim 1, wherein the first type is NFET and the second type is PFET.

5. The semiconductor device of claim 1, wherein the first type is PFET and the second type is NFET.

* * * * *